United States Patent
Daniels et al.

(10) Patent No.: US 6,818,552 B2
(45) Date of Patent: Nov. 16, 2004

(54) METHOD FOR ELIMINATING REACTION BETWEEN PHOTORESIST AND OSG

(75) Inventors: Brian J. Daniels, La Honda, CA (US); Jude A. Dunne, Menlo Park, CA (US); Joseph T. Kennedy, San Jose, CA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/243,528

(22) Filed: Sep. 13, 2002

(65) Prior Publication Data
US 2003/0032274 A1 Feb. 13, 2003

Related U.S. Application Data

(62) Division of application No. 09/748,692, filed on Dec. 26, 2000, now Pat. No. 6,583,047.

(51) Int. Cl.[7] .................. H01L 21/4763; H01L 21/42
(52) U.S. Cl. .................. 438/638; 438/623; 438/634; 438/798
(58) Field of Search .................. 438/798, 637–640, 438/622–624, 634, 725, 685

(56) References Cited

U.S. PATENT DOCUMENTS

| | | | |
|---|---|---|---|
| 5,021,840 A | 6/1991 | Morris | 357/15 |
| 5,494,854 A | 2/1996 | Jain | 437/195 |
| 5,763,123 A | 6/1998 | Shishido et al. | 430/30 |
| 5,783,365 A | 7/1998 | Tsujita | 430/311 |
| 5,801,094 A | 9/1998 | Yew et al. | 438/624 |
| 6,057,239 A * | 5/2000 | Wang et al. | 438/689 |
| 6,066,578 A | 5/2000 | Gupta et al. | 438/790 |
| 6,093,966 A | 7/2000 | Venkatraman et al. | 257/751 |
| 6,140,226 A | 10/2000 | Grill et al. | 438/637 |
| 6,171,951 B1 * | 1/2001 | Lee et al. | 438/640 |
| 6,211,061 B1 | 4/2001 | Chen et al. | 438/622 |
| 6,287,955 B1 * | 9/2001 | Wang et al. | |
| 6,319,809 B1 | 11/2001 | Chang et al. | 438/597 |
| 6,323,121 B1 * | 11/2001 | Liu et al. | |
| 6,350,682 B1 * | 2/2002 | Liao | |
| 6,440,861 B1 * | 8/2002 | Liu et al. | |

FOREIGN PATENT DOCUMENTS

EP 0975017 7/1999

OTHER PUBLICATIONS

Webster's dictionary, Houghton Mifflin Company, 1995, pp 704–705.*
Wolf, et al., Silicon Processing For The VLSI Era, vol. 1, Lattice Press, 1986, pp. 407–409.
"High Stud–To–Line Contact Area in Damascene Metal Processing"; IBM Technical Disclosure Bulletin, vol. 33 No. 1A, Jun. 1990.

* cited by examiner

Primary Examiner—Ha Tran Nguyen
(74) Attorney, Agent, or Firm—Roberts & Roberts, LLP

(57) ABSTRACT

A method of forming a microelectronic device while preventing photoresist poisoning. Various layers of conductive metals and dielectric materials are deposited onto a substrate in selective sequence to form an integrated circuit. Vias and trenches are formed throughout the structure by exposing and patterning a photoresist material. The dielectric materials of the insulating layers are protected from the photoresist to prevent chemical reactions which lead to photoresist poisoning. This is done by forming a modified surface layer on the dielectric material by either depositing an additional layer that covers the dielectric material, or by modifying the exposed surface of the dielectric material to a plasma or chemical treatment.

24 Claims, 22 Drawing Sheets

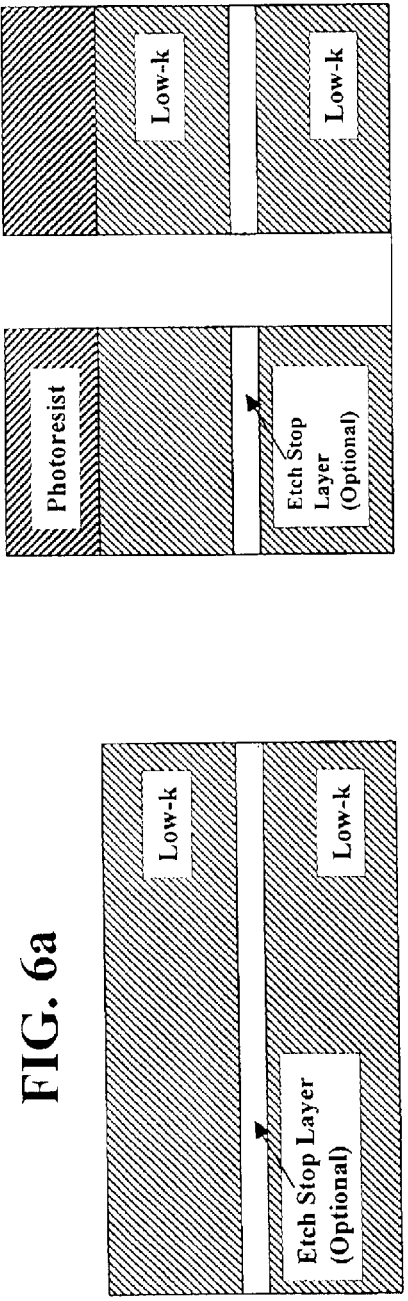
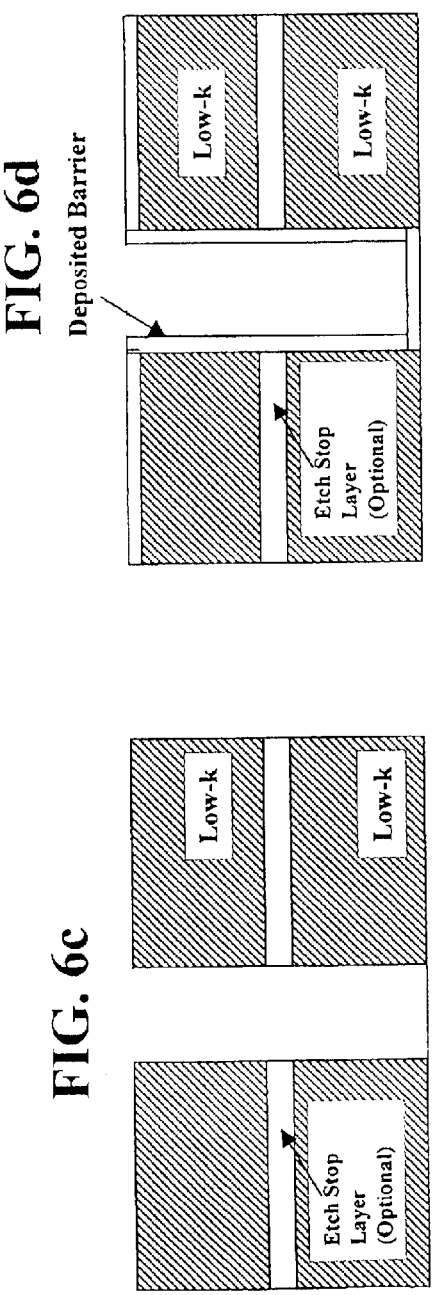

METHOD FOR ELIMINATING REACTION BETWEEN PHOTORESIST AND OSG

CROSS REFERENCE TO RELATED APPLICATION

This application is a division of U.S. patent application Ser. No. 09/748,692 filed Dec. 26, 2000 now U.S. Pat. No. 6,583,047 which is incorporated herein by reference.

BACKGROUND OF THE INVENTION

1. Field of the Invention

The present invention relates to the formation of structures in microelectronic devices such as integrated circuit devices. More particularly, the invention relates to the prevention of photoresist poisoning during the formation of microelectronic devices.

2. Description of the Related Art

In the fabrication of microelectronic devices; it is, known in the art to deposit various metal layers and insulation layers onto a substrate in selective sequence to form an integrated circuit (IC). As used herein, the term "microelectronic device" includes integrated circuits, intermetal dielectrics, and the like. Typically, a first level metal layer is deposited on a substrate, and is separated from a second level metal layer by one or more insulation layers. Subsequent metal layers may, in turn, be separated by one or more further insulation layers.

Insulation layers, which typically include dielectric materials such as silicon dioxide, silicon oxynitride, fluorinated silicate glass (FSG), spin-on glass (SOG) and the like, serve as electrical insulation between intermetal dielectric layers. These insulation layers are typically deposited by conventional techniques such as chemical vapor deposition (CVD) and the like, and serve as protective layers or gap fillers to achieve planarization of the substrate. The metal layers typically comprise conductive metals such as aluminum, copper, titanium, tantalum, tungsten and the like.

During the formation of these microelectronic devices, it is necessary to remove portions of the dielectric using standard photolithography and etching techniques. Trenches, vias and the like are formed within the dielectric and are filled with conductive metals to form electrical connections with metal contacts in the integrated circuit. Upon such processing, the dielectric can come in contact with other materials, including but not limited to photoresist and antireflective coatings (ARC's).

One problem that arises from this contact between materials is that a reaction between the photoresist and certain dielectrics may occur. This is particularly important for a class of dielectric materials referred to as organosilicate glasses (OSGs), which includes trade name materials such as HOSP™, Black Diamond™ and Coral™. These materials can be either porous or non-porous. These materials are extremely attractive in the industry as their dielectric constant is much lower than that of silicon dioxide. The reaction that occurs between the OSG and the photoresist/ARC creates a reaction product in vias which is difficult to remove by etching, ashing, and/or chemical stripping. As a result, the subsequent patterning of the interconnect structure is no longer defined by the photoresist and photoresist rework may become difficult or impossible. This phenomenon is known as "photoresist poisoning", "resist poisoning", "nailheading", and/or "mushrooming". Upon development, photoresist poisoning causes the exposed pattern areas of the photoresist layer to have a photoresist profile or structure with non-uniform side walls. Where a positive photoresist is used, photoresist poisoning often leads to the formation of a photoresist footing, or a widening of the photoresist line just above the substrate. Where a negative photoresist is used, photoresist pinching may result, which is a formation of non-uniform side walls of the photoresist profile on the underlying substrate after photolithographic exposure and development. After etching, such photoresist footing or photoresist pinching problem will lead to an imperfect transfer of the photoresist pattern to the underlying layer or layers. For some preferred methods of interconnect fabrication, in particular the dual Damascene process, this OSG/photoresist reaction can make interconnection formation difficult or impossible.

It would be desirable to devise a method of forming integrated circuits which avoids poisoning of the photoresist layer during resist formation. The subject of this invention is that the deposition or creation of an intermediate layer between the dielectric material and the photoresist inhibits the reaction which causes photoresist poisoning.

According to the present invention, the dielectric materials of the insulating layers are protected from the photoresist material to prevent chemical reactions which lead to photoresist poisoning. This is done by forming a modified surface layer on the dielectric material by either depositing an additional layer that covers the dielectric material, or by modifying the exposed surface of the dielectric material to a plasma or chemical treatment.

SUMMARY OF THE INVENTION

The present invention provides a process for producing a microelectronic device which comprises:

(a) forming a first dielectric layer on a substrate;
(b) forming an optional etch stop layer on the first dielectric layer;
(c) forming a second dielectric layer on the first dielectric layer or the optional etch stop layer;
(d) depositing a layer of a photoresist on a top surface of the second dielectric layer and imagewise removing a portion of the photoresist corresponding to at least one via for the first dielectric layer;
(e) removing the portions of each layer which are under the removed portions of the photoresist thus forming at least one via down through the first dielectric layer, and removing the balance of the photoresist layer;
(f) depositing a protective material on the top surface of the second dielectric layer and on inside walls and a floor of the via;
(g) depositing an additional layer of a photoresist on the protective material and imagewise removing a portion of the photoresist corresponding, to at least one trench for the second dielectric layer;
(h) removing the portions of each layer which are under the removed portion of the additional photoresist layer thus forming at least one trench down through the second dielectric layer;
(i) removing the balance of the additional photoresist layer and the balance of the protective material;
(j) lining a barrier metal on inside walls and a floor of the trench, and on inside walls and a floor of the via; and
(k) filling the trench and via with a fill metal in contact with the barrier metal lining.

The present invention also provides a process for producing a microelectronic device which comprises:

(a) forming a first dielectric layer on a substrate;
(b) forming an optional etch stop layer on the first dielectric layer;

(c) forming a second dielectric layer on the first dielectric layer or the optional etch stop layer;
(d) depositing a layer of a photoresist on a top surface of the second dielectric layer and imagewise removing a portion of the photoresist corresponding to at least one via for the second dielectric layer;
(e) removing the portions of the second dielectric layer and the optional etch stop layer which are under the removed portions of the photoresist thus forming at least one via down through the second dielectric layer and the optional etch stop layer, and removing the balance of the photoresist layer;
(f) depositing a protective material on a top surface of the second dielectric layer and on inside walls and a floor of the via;
(g) depositing an additional layer of a photoresist on the protective material and imagewise removing a portion of the photoresist corresponding to at least one trench for the second dielectric layer;
(h) removing the portions of the protective material and the second dielectric layer which are under the removed portion of the additional photoresist layer thus forming at least one trench down through the second dielectric layer, and removing the portions of the first dielectric layer which are under the via which was in the second dielectric layer thus forming a via down through the first dielectric layer;
(i) removing the balance of the additional photoresist layer and the balance of the protective material;
(j) lining a barrier metal on inside walls and a floor of the trench, and on inside walls and a floor of the via; and
(k) filling the trench and via with a fill metal in contact with the barrier metal lining.

The present invention further provides a process for producing a microelectronic device which comprises:
(a) forming a first dielectric layer on a substrate;
(b) forming an optional etch stop layer on the first dielectric layer;
(c) forming a second dielectric layer on the first dielectric layer or the optional etch stop layer;
(d) depositing a layer of a photoresist on a top surface of the second dielectric layer and imagewise removing a portion of the photoresist corresponding to at least one trench for the second dielectric layer;
(e) removing the portions of the second dielectric layer which are under the removed portions of the photoresist thus forming at least one trench down through the second dielectric layer, and removing the balance of the photoresist layer;
(f) depositing a protective material on a top surface of the second dielectric layer and on inside walls and a floor of the trench;
(g) depositing an additional layer of a photoresist on the protective material and imagewise removing a portion of the photoresist corresponding to at least one via for the first dielectric layer;
(h) removing the portions of each layer which are under the removed portion of the additional photoresist layer thus forming at least one via down through the protective material, the optional etch stop layer, and the first dielectric layer;
(i) removing the balance of the additional photoresist layer and the balance of the protective material;
(j) lining a barrier metal on inside walls and a floor of the trench, and on inside walls and a floor of the via; and
(k) filling the trench and via with a fill metal in contact with the barrier metal lining.

The present invention still further provides a process for producing a microelectronic device which comprises:
(a) forming a first dielectric layer on a substrate;
(b) forming an optional etch stop layer on the first dielectric layer;
(c) forming a second dielectric layer on the first dielectric layer or the optional etch stop layer;
(d) depositing a layer of a photoresist on a top surface of the second dielectric layer and imagewise removing a portion of the photoresist corresponding to at least one via for the first dielectric layer;
(e) removing the portions of each layer which are under the removed portions of the photoresist thus forming at least one via through the second dielectric layer, the optional etch stop layer, and first dielectric layer, and removing the balance of the photoresist layer;
(f) modifying the top surface of the second dielectric layer, and a surface of inside walls of the via through the second dielectric layer, optional etch stop layer, and first dielectric layer thus forming a protective material thereon;
(g) depositing an additional layer of a photoresist on the protective material on the top surface of the second dielectric layer and on the protective material on the walls and a floor of the via through the second dielectric layer, optional etch stop layer, and first dielectric layer, and imagewise removing a portion of the photoresist corresponding to at least one trench for the second dielectric layer;
(h) removing the portions of the protective material on the top surface of the second dielectric layer, the second dielectric layer, and the walls of the via within the second dielectric layer, which are under the removed portion of the additional photoresist layer thus forming at least one trench down through the second dielectric layer, and removing the balance of the additional photoresist layer;
(i) lining a barrier metal on inside walls and a floor of the trench, and on inside walls and a floor of the via; and
(j) filling the trench and via with a fill metal in contact with the barrier metal lining.

The present invention still further provides a process for producing a microelectronic device which comprises:
(a) forming a first dielectric layer on a substrate;
(b) forming an optional etch stop layer on the first dielectric layer;
(c) forming a second dielectric layer on the first dielectric layer or the optional etch stop layer;
(d) depositing a layer of a photoresist on a top surface of the second dielectric layer and imagewise removing a portion of the photoresist corresponding to at least one via for the second dielectric layer and the optional etch stop layer;
(e) removing the portions of the second dielectric layer and the optional etch stop layer which are under the removed portions of the photoresist thus forming at least one via down through the second dielectric layer and the optional etch stop layer, and removing the balance of the photoresist layer;
(f) modifying a top surface of the second dielectric layer, and a surface of inside walls of and a floor of the via through the second dielectric layer and optional etch stop layer thus forming a protective material thereon;
(g) depositing an additional layer of a photoresist on the protective material on the top surface of the second dielectric layer and on the protective material on the walls and floor of the via through the second dielectric layer and the optional etch stop layer, and imagewise removing a portion of the photoresist corresponding to at least one trench for the second dielectric layer;

(h) removing the portions of the protective material on the top surface of the second dielectric layer, the second dielectric layer, and the protective material on the walls of the via within the second dielectric layer which are under the removed portion of the additional photoresist layer thus forming at least one trench down through the second dielectric layer, and removing the portions of the protective material on the floor of the via which was in the second dielectric layer, and portions of the first dielectric layer under the via which was in the second dielectric layer thus forming at least one via down through the first dielectric layer;

(i) removing the balance of the additional photoresist layer;

(j) lining a barrier metal on inside walls and a floor of the trench, and on inside walls and a floor of the via; and (k) filling the trench and via with a fill metal in contact with the barrier metal lining.

The present invention still further provides a process for producing a microelectronic device which comprises:

(a) forming a first dielectric layer on a substrate;
(b) forming an optional etch stop layer oh the first dielectric layer;
(c) forming a second dielectric layer on the first dielectric layer or the optional etch stop layer;
(d) depositing a layer of a photoresist on a top surface of the second dielectric layer and imagewise removing a portion of the photoresist corresponding to at least one via for the first dielectric layer;
(e) removing the portions of each layer which are under the removed portions of the photoresist thus forming at least one via through the second dielectric layer, optional etch stop and first dielectric layer, and removing the balance of the photoresist layer;
(f) depositing a barrier material on a top surface of the second dielectric layer, and a surface of inside walls and a floor of the via through the second dielectric layer, optional etch stop and first dielectric layer thus forming a barrier material layer thereon;
(g) depositing an additional layer of a photoresist on the barrier material layer on the top surface of the second dielectric layer and on the walls and a floor of the via through the second dielectric layer, optional etch stop layer, and first dielectric layer, and imagewise removing a portion of the photoresist corresponding to at least one trench for the second dielectric layer;
(h) removing the portions of the barrier material layer on the top surface of the second dielectric layer, the second dielectric layer, and the barrier material layers on the walls of the via within the second dielectric layer which are under the removed portion of the additional photoresist layer thus forming at least one trench down through the second dielectric layer, and removing the balance of the additional photoresist layer;
(i) lining a barrier metal on inside walls and a floor of the trench, and on the inside walls and floor of the via; and
(j) filling the trench and via with a fill metal in contact with the barrier metal lining.

The present invention still further provides a process for producing a microelectronic device which comprises:

(a) forming a first dielectric layer on a substrate;
(b) forming an optional etch stop layer on the first dielectric layer;
(c) forming a second dielectric layer on the first dielectric layer or the optional etch stop layer;
(d) depositing a layer of a photoresist on a top surface of the second dielectric layer and imagewise removing a portion of, the photoresist corresponding to at least one via for the second dielectric layer and the optional etch stop layer;

(e) removing the portions of the second dielectric layer and the optional etch stop layer which are under the removed portions of the photoresist thus forming at least one via down through the second dielectric layer and the optional etch stop layer, and removing the balance of the photoresist layer;

(f) depositing a barrier material on a top, surface of the second dielectric layer, and a surface of inside walls and a floor of the via through the second dielectric layer and optional etch stop layer thus forming a barrier material layer thereon;

(g) depositing an additional layer of a photoresist on the barrier material layer on the top surface of the second dielectric layer and on the walls and a floor of the via through the second dielectric layer and the optional etch stop layer, and imagewise removing a portion of the photoresist corresponding to at least one trench for the second dielectric layer;

(h) removing the portions of the barrier material layer on the top surface of the second dielectric layer, the second dielectric layer, and the barrier material layers on the walls of the via within the second dielectric layer which are under the removed portion of the additional, photoresist layer thus forming at least one trench down through the second dielectric layer, and removing the portions of the barrier material layer from the floor of the via which was in the second dielectric layer, and portions of the first dielectric layer under the via which was in the second dielectric layer thus forming at least one via down through the first dielectric layer;

(i) removing the balance of the additional photoresist layer;

(j) lining a barrier metal on inside walls and a floor of the trench, and on the inside walls and floor of the via; and (k) filling the trench and via with a fill metal in contact with the barrier metal lining.

The present invention still further provides a process for producing a microelectronic device which comprises:

(a) forming a first dielectric layer on a substrate;
(b) forming an optional etch stop layer on the first dielectric layer;
(c) forming a second dielectric layer on the first dielectric layer or the optional etch stop layer;
(d) depositing a layer of a photoresist on a top surface of the second dielectric layer and imagewise removing a portion of the photoresist corresponding to at least one trench for the second dielectric layer;
(e) removing the portions of the second dielectric layer which are under the removed portions of the photoresist thus forming at least one trench through the second dielectric layer, and removing the balance of the photoresist layer;
(f) modifying a top surface of the second dielectric layer, and a surface of inside walls and a floor of the trench thus forming a protective material thereon;
(g) depositing an additional layer of a photoresist on the protective material on the top surface of the second dielectric layer, and the protective material on the walls and floor of the trench, and imagewise removing a portion of the photoresist corresponding to at least one via for the first dielectric layer;
(h) removing the portions of each layer which are under the removed portion of the additional photoresist layer thus forming at least one via down through the first dielectric layer, and removing the balance of the additional photoresist layer;
(i) lining a barrier metal on inside walls and a floor of the trench, and on inside walls and a floor of the via; and (j) filling the trench and via with a fill metal in contact with the barrier metal lining.

The present invention still further provides a process for producing a microelectronic device which comprises:

(a) forming a first dielectric layer on a substrate;
(b) forming an optional etch stop layer on the first dielectric layer;
(c) forming a second dielectric layer on the first dielectric layer or the optional etch stop layer;
(d) depositing a layer of a photoresist on a top surface of the second dielectric layer and imagewise removing a portion of the photoresist corresponding to at least one trench for the second dielectric layer;
(e) removing the portions of the second dielectric layer and optionally removing the etch stop layer, if present, which are under the removed portions of the photoresist thus forming at least one trench through the second dielectric layer and optionally through the etch stop layer, and removing the balance of the photoresist layer;
(f) depositing a barrier material on a top surface of the second dielectric layer, and a surface of inside walls and a floor of the trench thus forming a barrier material layer thereon;
(g) depositing an additional layer of a photoresist on the barrier material layer on the top surface of the second dielectric layer and the inside walls and floor of the trench, and imagewise removing a portion of the photoresist corresponding to at least one via for the first dielectric layer;
(h) removing the portions of each of the barrier material layer on the floor of the trench, any remaining portions of the etch stop layer, and portions of the first dielectric layer which are under the removed portion of the additional photoresist layer, thus forming at least one via down through the barrier material layer on the floor of the trench, the optional etch stop layer, and the first dielectric layer, and removing the balance of the additional photoresist layer;
(i) lining a barrier metal on the barrier material layer on the inside walls and floor of the trench, and on inside walls and a floor of the via; and
(j) filling the trench and via with a fill metal in contact with the barrier metal lining.

The present invention still further provides a process for producing a microelectronic device which comprises:

(a) forming a first dielectric layer on a substrate;
(b) forming an optional etch stop layer on the first dielectric layer;
(c) forming a second dielectric layer on the first dielectric layer or the optional etch stop layer;
(d) forming a first hardmask layer on the second dielectric layer;
(e) forming a second hardmask layer on the first hardmask layer;
(f) depositing a layer of a photoresist on a top surface of the second hardmask layer and imagewise removing a portion of the photoresist corresponding to at least one via for the second hardmask layer;
(g) removing the portions of the second hardmask layer which are under the removed portions of the photoresist thus forming at least one via through the second hardmask layer, and removing the balance of the photoresist layer;
(h) depositing an additional layer of a photoresist on the top surface of the second hardmask layer and on inside walls and floor of the via in the second hardmask, and imagewise removing a portion of the photoresist corresponding to at least one trench for the second hardmask layer;
(i) removing the portions of the first hardmask layer and the second dielectric layer which are under the via in the second hardmask layer thus forming at least one via down through the first hardmask layer and the second dielectric layer;
(j) removing the portions of the second hardmask layer which are under the removed portions of the additional photoresist thus forming at least one trench down through the second hardmask layer, and removing the portions of the optional etch stop layer which are under the via in the second dielectric layer thus extending the via down through the optional etch stop layer;
(k) removing the portions of the first hardmask layer and the second dielectric layer which are under the trench in the second hardmask layer thus forming at least one trench down through the first hardmask layer and the second dielectric layer; removing the portions of the first dielectric layer under the via which was in the second dielectric layer thus forming a via through the first dielectric layer, and removing the balance of the additional photoresist layer;
(l) lining a barrier metal on inside walls and a floor of the trench, and on inside walls and a floor of the via; and
(m) filling the trench and via with a fill metal in contact with the barrier metal lining.

The present invention still further provides a process for producing a microelectronic device which comprises:

(a) forming a first dielectric layer on a substrate;
(b) forming an optional etch stop layer o n the first dielectric layer;
(c) forming a second dielectric layer on the first dielectric layer or the optional etch stop layer;
(d) forming a first hardmask layer on the second dielectric layer;
(e) forming a second hardmask layer on the first hardmask layer;
(f) depositing a layer of a photoresist on a top surface of the second hardmask layer and imagewise removing a portion of the photoresist corresponding to at least one trench for the second hardmask layer;
(g) removing the portions of the second hardmask layer which are under the removed portions of the photoresist thus forming at least one trench through the second hardmask layer, and removing the balance of the photoresist layer;
(h) depositing an additional layer of a photoresist on the top surface of the second hardmask layer and on inside walls and floor of the trench, and imagewise removing a portion of the photoresist corresponding to at least one via for the second dielectric layer and the optional etch stop layer;
(i) removing the portions of the first hardmask layer, the second dielectric layer, and the optional etch stop layer which are under the removed portion of the additional photoresist layer thus forming at least one via down through the second dielectric layer and optional etch stop layer, and removing the balance of the additional photoresist layer;
(j) removing the portions of the first hardmask layer and the second dielectric layer which are under the trench in the second hardmask layer thus forming at least one trench down through the second dielectric layer and removing the portions of the first dielectric layer corresponding to the via in the second dielectric layer or optional etch stop layer, thus forming at least one via down through the first dielectric layer;
(k) lining a barrier metal on inside walls and a floor of the trench, and on inside walls and a floor of the via; and (l) filling the trench and via with a, fill metal in contact with the barrier metal lining.

BRIEF DESCRIPTION OF THE DRAWINGS

FIGS. 6(a)–(h) show a sixth embodiment of the present invention, showing a deep, via first technique together with a barrier material layer.

DETAILED DESCRIPTION OF THE PREFERRED EMBODIMENTS

Figure 1B:
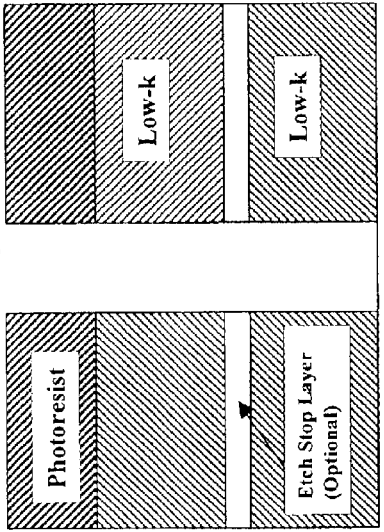
FIGS. 1(a)–(h) show a first embodiment of the present invention, showing a deep, via first technique together with a deposited protective material.
Figure 1D:
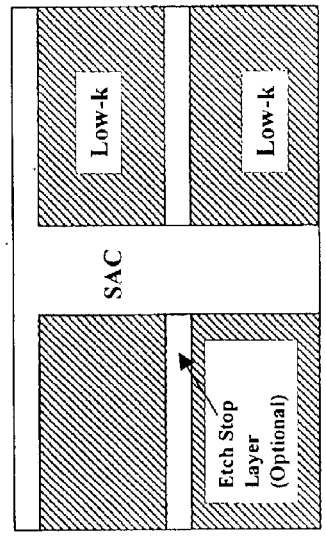
Figure 1A:
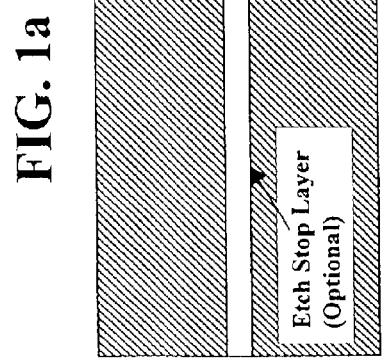
Figure 1C:
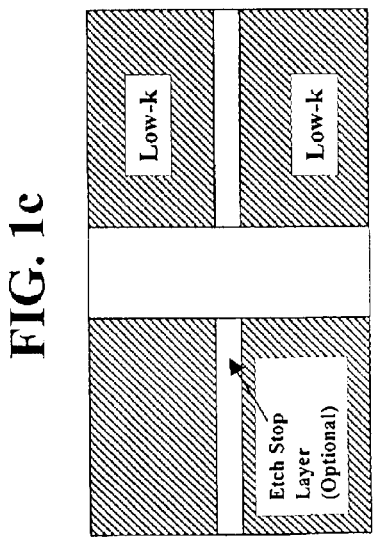
Figure 1E:
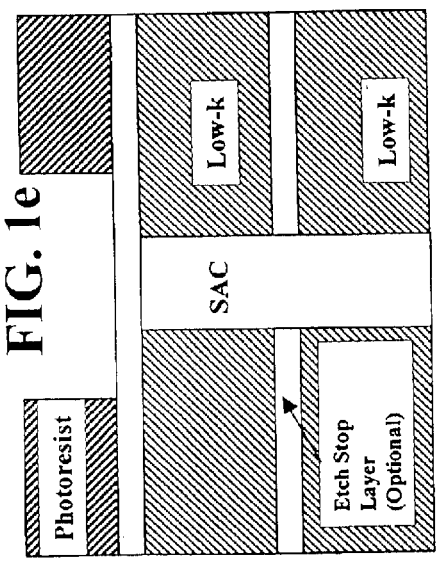
Figure 1F:
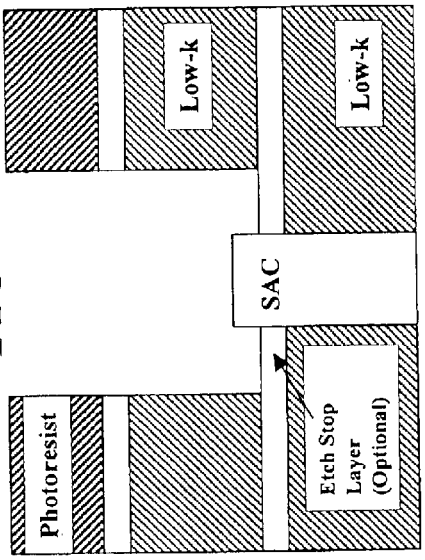
Figure 1G:
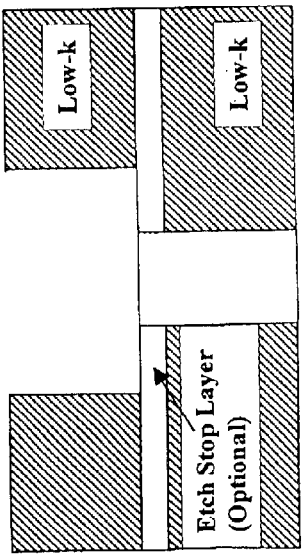
Figure 1H:
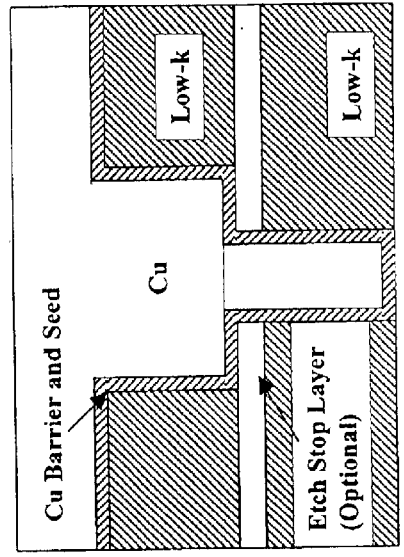

In a first embodiment of the present invention, as shown in FIG. 1(a), a first dielectric material is deposited onto a surface of a substrate to form a first dielectric layer on the substrate. An optional etch stop material may then be deposited onto the first dielectric layer to form an optional etch stop layer. A second dielectric material is then deposited onto the first dielectric layer or the optional etch stop layer to thereby form a second dielectric layer. A layer of a photoresist material is then deposited onto a top surface of the second dielectric layer, and a portion of the photoresist is imagewise removed by standard photolithographic techniques to outline a via for the first dielectric layer. Portions of each layer under the removed portions of the photoresist are then removed to form at least one via down through the first dielectric layer, as shown in FIG. 1(b). The balance of the photoresist layer is then removed, as in FIG. 1(c). A protective material, in this case a sacrificial film (SAC) is deposited onto a top surface of the second dielectric layer and on inside walls and a floor of the via, as shown in FIG. 1(d). An additional layer of a photoresist is then deposited on the protective material, and then a portion of the additional photoresist is imagewise removed to outline at least one trench for the second dielectric layer, as shown in FIG. 1(e). Portions are removed from the protective material and the second dielectric material under the removed portions of the additional photoresist, to form at least one trench down through the second dielectric layer, as shown in FIG. 1(f). The balance of the additional photoresist layer is then removed, and the balance of the protective material is removed, as shown in FIG. 1(g). Inside walls and a floor of the via and the trench are then lined with a barrier metal, and then the trench and via are filled with a fill metal in contact with the barrier metal lining, as shown in FIG. 1(h).

Suitable substrates useful for the techniques described above include those suitable to be processed into an integrated circuit or other microelectronic device. Substrates non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon dioxide. (SiO$_2$) and mixtures thereof and may include metal contact lines which are typically formed by well known lithographic techniques. Suitable materials for the metal contacts include aluminum, aluminum alloys, copper, copper alloys, titanium, tantalum, and tungsten. These lines form the conductors of an integrated circuit. Such are typically closely separated from one another at distances preferably of from about 20 micrometers or less, more preferably from about 1 micrometer or less, and most preferably of from about 0.05 to about 1 micrometer.

The first dielectric layer and the second dielectric layer, may comprise any organic or inorganic dielectric material commonly used in the production of microelectronic devices. It is most preferred to use dielectrics of low dielectric constant, k, values in the practice of the present invention. The dielectrics may nonexclusively include OSG's, silicon containing spin-on glasses, i.e. silicon containing polymer such as an alkoxysilane polymer, a silsesquioxane polymer, a siloxane polymer; a poly(arylene ether), a fluorinated poly(arylene ether), other polymeric dielectric materials, nanoporous silica, or mixtures thereof. One useful polymeric dielectric material useful for the invention includes an nanoporous silica alkoxysilane polymer formed from an alkoxysilane monomer which has the formula:

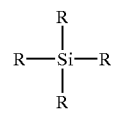

wherein at least 2 of the R groups are independently $C_1$ to $C_4$ alkoxy groups and the balance, if any, are independently selected, from the group consisting of hydrogen, alkyl, phenyl, halogen, substituted phenyl. Preferably each R is methoxy, ethoxy or propoxy. Such are commercially available from Honeywell International Inc. as Nanoglass™. The most preferred alkoxysilane monomer is tetraethoxysilane (TEOS). Also useful are hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention non-exclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. The hydroorganosiloxanes, poly(arylene ethers), fluorinated poly(arylene ethers) and mixtures thereof are preferred. Suitable poly(arylene ethers) or fluorinated poly(arylene ethers) are known in the art from U.S. Pat. Nos. 5,155,175; 5,114,780 and 5,115,082. Preferred poly(arylene ethers) and fluorinated poly(arylene ethers) are disclosed in U.S. patent application Ser. No. 08/990,157 filed Dec. 12, 1997 which is incorporated herein by reference. Preferred siloxane materials suitable for use in this invention are commercially available from Honeywell International Inc. under the tradename Accuglass® T-11, T-12 and T-14. Also useful are methylated siloxane polymers available from Honeywell International Inc. under the tradenames Purespin™ and Accuspin® T18, T23 and T24. Preferred silicon containing dielectric polymers have a formula selected from the group consisting of $[(HSiO_{1.5})_xO_y]_n$, $(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl which are disclosed in U.S. patent application Ser. No. 08/955,802 filed Oct. 22, 1997 and which is incorporated herein by reference. Also preferred are certain low organic content silicon containing polymers such as those having the formula I:

[H—SiO$_{1.5}$]$_n$[R—SiO$_{1.5}$]$_m$,

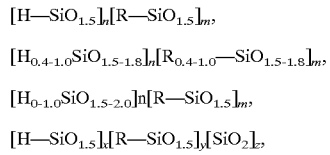

[H$_{0-1.0}$SiO$_{1.5-2.0}$]$_n$[R—SiO$_{1.5}$]$_m$,

[H—SiO$_{1.5}$]$_x$[R—SiO$_{1.5}$]$_y$[SiO$_2$]$_z$, wherein the sum of n and m, or the sum or x, y and z is from about 8 to about 5000, and m and y are selected such that carbon containing, substituents are present in an amount of less than about 40 Mole percent. Polymers having the structure I are of low organic content where the carbon containing substituents are present in an amount of less than about 40 mole percent. These polymers are described more fully in U.S. patent application Ser. No. 09/044,831, filed Mar. 20, 1998, which is incorporated herein by reference. Also preferred are certain high organic content silicon containing polymers such as those having the formula II:

[HSiO$_{1.5}$]$_n$[RSiO$_{1.5}$]$_m$,

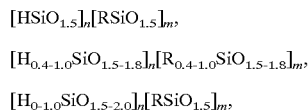

[H$_{0-1.0}$SiO$_{1.5-2.0}$]$_n$[RSiO$_{1.5}$]$_m$, wherein the sum of n and m is from about 8 to about 5000 and m is selected such that the carbon containing substituent is present in an amount of from about 40 Mole percent or greater; and

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials. Polymers having the structure II which are of high organic content where the carbon containing substituents are present in an amount of about 40 mole percent or more. These polymers are described more fully in U.S. patent application Ser. No. 09/044,798, filed Mar. 20, 1998, which is incorporated herein-by reference. The polymer may be present in the dielectric composition in a pure or neat state (not mixed with any solvents) or it may be present in a solution where it is mixed with solvents. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 80% to about 97%. Suitable solvents nonexclusively include aprotic solvents such as cyclic ketones including cyclopentanone, cyclohexanone, cyclohexanne and cyclooctanone; cyclic amides such as N-alkylpyrrolidinone wherein the alkyl group has from 1 to about 4 carbon atoms, and N-cyclohexyl-pyrrolidinone, and mixtures thereof.

Deposition of dielectric materials onto the substrate may be conducted via conventional methods such as spin-coating, dip coating, roller coating, spraying, chemical vapor deposition, meniscus coating, and the like which are well-known in the art. Spin coating is most preferred. The thickness of the dielectric layers may vary depending on the deposition procedure and parameter setup, but typically the thickness may range from about 500 Å to about 50,000 Å, and preferably from about 2000 Å to about 12000 Å. In the most preferred embodiment, a liquid dielectric composition is spun onto the appropriate surface according to known spin techniques such as by applying a liquid dielectric composition to the surface and then spinning on a rotating wheel at speeds ranging from about 500 to about 6000 rpm for about 5 to about 60 seconds.

The dielectric materials may optionally be heated to expel residual solvent or to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven. Heating is preferably conducted at a temperature of from about 80° C. to about 500° C., and more preferably from about 150° C. to about 425° C. This heating is preferably performed from about 1 minute to about 360 minutes, and more preferably from about 2 to about 60 minutes. The dielectric materials may also optionally be exposed to actinic light, such as UV light, to increase their molecular weight. The amount of exposure may range from about 100 mJ/cm$^2$ to about 300 mJ/cm$^2$. The dielectric materials may optionally be cured by overall exposed to electron beam radiation. Electron beam exposure may be controlled by setting the beam acceleration. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision Corporation of San Diego, Calif. under the trade name "ElectronCure™". The principles of operation and performance characteristics of such device are described in U.S. Pat. No. 5,003,178, the disclosure of which is incorporated herein by reference. The temperature of the electron beam exposure preferably ranges from about 20° C. to about 450° C., more preferably from about 50° C. to about 400° C. and most preferably from about 200° C. to about 400° C. The electron beam energy is preferably from about 0.5 KeV to about 30 KeV, and more preferably from about 3 to about 10 KeV. The dose of electrons is preferably from, about 1 to about 50,000 $\mu C/cm^2$ and more preferably from about 50 to about 20,000 $\mu C/cm^2$. The gas ambient in the electron beam tool can be any of the following gases: nitrogen, oxygen, hydrogen, argon, a blend of hydrogen and nitrogen, ammonia, xenon or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches.

In the practice of the present invention, it is preferred that the first dielectric layer has significantly different etch resistance properties from the optional etch stop layer, and the optional etch stop layer has significantly different etch resistance properties from the second dielectric layer. The first dielectric layer may be the same or different from the second dielectric layer. If the optional etch stop layer is not present, the first dielectric layer should have substantially the same or significantly different etch resistance properties from the second dielectric layer. When the first and second dielectric layers have substantially the same etch resistance properties and no etch stop layer is present, etching may be done by controlling the duration of time for the etching of each layer. Useful etch stop layers non-exclusively include silicon nitride, silicon oxynitride, silicon dioxide, silicon carbide, silicon oxycarbide, spin on solutions such as spin on glass, organic polymers, hydrogen silsesquioxane and methyl silsesquioxane and combinations thereof.

The photoresist component may be positive working or negative working and is generally commercially available. Positive working photoresists are more preferred in the practice of the present invention. Suitable positive working photoresist materials are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. The photoresist material may be deposited by conventional means such as spin coating. The thickness of photoresist layers may vary depending on the deposition procedure and parameter setup. The thickness preferably ranges from about 1,000 Å to about 30,000 Å, more preferably, from about 2,000 Å to about 10,000 Å, and most preferably from about 3,000 Å to about 7,500 Å.

Imagewise removal of the photoresist is conducted in a manner well known in the art such as by imagewise exposing the photoresist to actinic radiation such as through a suitable mask and developing the photoresist The photoresist may be imagewise exposed to actinic radiation such as light in the visible, ultraviolet or infrared regions of the spectrum through a mask, or scanned by an electron beam, ion or neutron beam or x-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the non-image portions and define a via mask.

Via is a term known in the art which includes holes and apertures. Vias may be filled with metals or other conductive materials to form electrical connections with other metals or conductive contacts. Although this invention refers to at least one via, it is preferred that a plurality of vias be formed in the practice of the present invention. These vias preferably extend downward to underlying metal contacts.

Trench is a term known in the art which includes tunnel-like connections between vias. Like vias trenches also may be filled with metals or other conductive materials to form electrical connections with other metals or conductive contacts. Although this invention refers to at least one trench, it is preferred that a plurality of trenches be formed in the practice of the present invention. These trenches preferably connect two or more vias.

The protective material serves to prevent contact between the photoresist and the dielectrics, thus preventing resist poisoning. The protective material may be deposited onto a surface of a dielectric material, as described above, or it may be formed on the surface of a dielectric material through surface modification, as described below.

A deposited protective material may be deposited by conventional means such as CVD, PVD, spin coating or the like. Suitable deposited protective materials nonexclusively include CVD oxide, CVD nitride, CVD oxynitride, CVD SiC, spin on solutions such as organic polymers, SOG, chromophore laden SOGs such as those described in U.S. patent application Ser. No. 09/330,248 filed Jun. 10, 1999 which is incorporated herein by reference, anti reflective coating (ARC) materials such as -those described in U.S. Pat. No. 6,033,830 and bottom anti reflective coating materials (BARC) such as silicon oxynitrides and the materials described in U.S. Pat. No. 6,121,123, hydrogen silsesquioxane and methyl silsesquioxane and metals such as Ta and TaN. Preferably, the deposited protective material may comprise SOG and chromophore laden SOG. The most preferred deposited protective material in the practice of this invention is chromophore laden SOG.

The barrier metal on the sidewalls and floor of the vias and trenches serves to prevent diffusion of the subsequently deposited conductive metal into the dielectric layers. Suitable barrier metals nonexclusively, include Ti, Ta, or a nitride such as TaN or TiN. Barrier metals may be applied by conventional techniques such as vapor deposition, sputtering, evaporation and the like. The thickness of the barrier metal may vary depending on the deposition procedure and parameter setup desired. The thickness preferably ranges from about 25 Å to about 1000 Å, more preferably from about 50 Å to about 500 Å, and most preferably from about 100 Å to about 300 Å.

Suitable fill metals include aluminum, aluminum alloys, copper, copper alloys, tantalum, tungsten, titanium or other metals or combinations thereof as typically employed in the formation of microelectronic devices. Copper is most preferred. The fill metals may also be applied by such techniques as vapor deposition, sputtering, evaporation, electroplating, electroless plating and the like. As used herein, the term "metal" includes amalgams of metals.

Figure 2A:
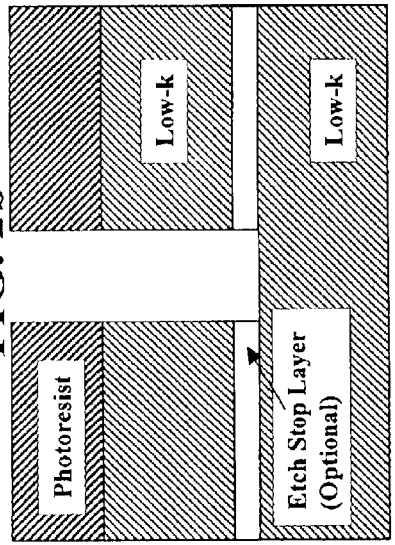
FIGS. 2(a)–(h) show a second embodiment of the present invention, showing a shallow, via first technique together with a deposited protective material.
Figure 2B:
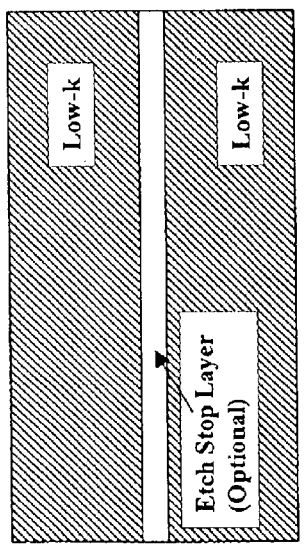
Figure 2C:
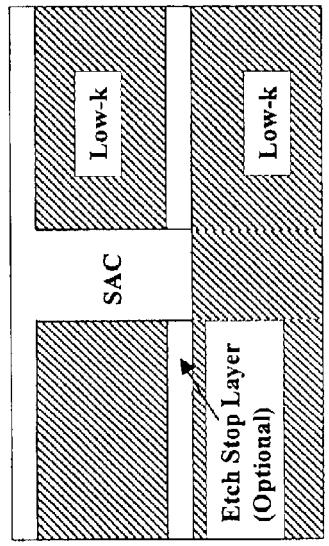
Figure 2D:
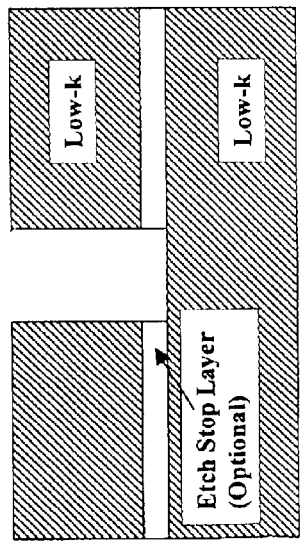
Figure 2F:
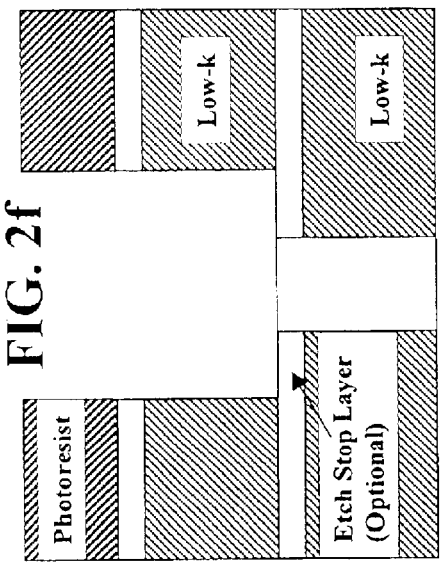
Figure 2H:
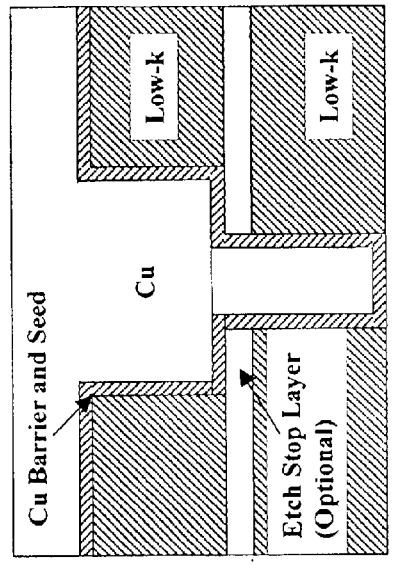
Figure 2E:
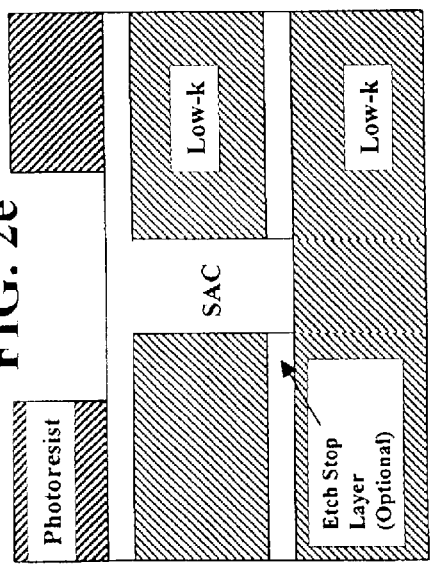
Figure 2G:
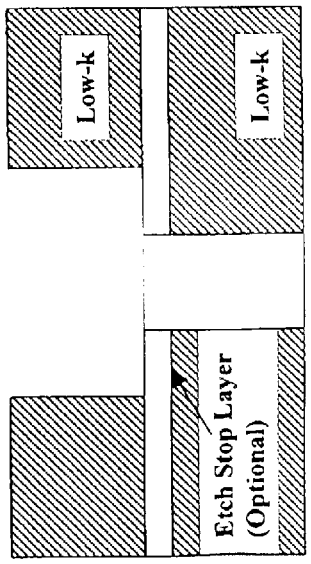

In a second embodiment of the present invention, as shown in FIG. 2(a), a first dielectric material, optional etch stop material, and second dielectric material are deposited onto a substrate as they were in the first embodiment of this invention. As shown in FIG. 2(b), a layer of a photoresist material is then deposited on the second dielectric layer, and a portion of the photoresist is imagewise removed to outline a via for the second dielectric layer. FIG. 2(b) also shows that portions are removed from the second dielectric layer and the optional etch stop layer which are under the removed portions of the photoresist to form at least one via down through the second dielectric layer and the optional etch stop layer. The balance of the photoresist layer is then removed, as shown in FIG. 2(c), and a protective material is deposited on a top surface of the second dielectric layer and on inside walls and a floor of the via, as shown in FIG. 2(d). An additional layer of a photoresist is deposited on the protective material, and then a portion of the additional photoresist is imagewise removed to outline a trench for the second dielectric layer, as shown in FIG. 2(e). Portions are removed from each of the protective material and the second dielectric layer which are under the removed portion of the additional photoresist layer, to form at least one trench down through the second dielectric layer, as shown in FIG. 2(f). Also shown in FIG. 2(f), portions of the first dielectric layer which are under the via which was in the second dielectric layer are removed to form a via down through the first dielectric layer. As shown in FIG. 2(g), the balance of the additional photoresist layer is then removed, and the balance of the protective material is removed. Inside walls and a floor of the via and the trench are lined with a barrier metal, and then the trench and via are filled with a fill metal in contact with the barrier metal lining, as shown in FIG. 2(h).

Figure 3B:
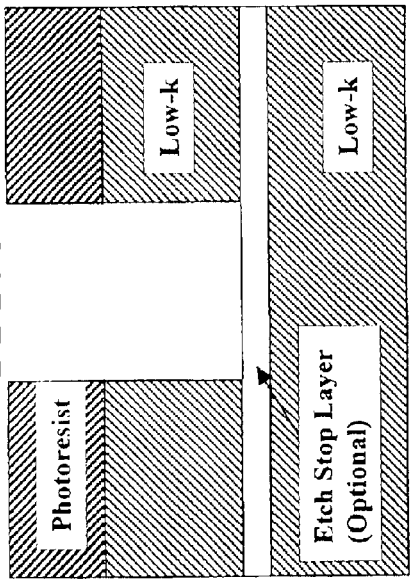
FIGS. 3(a)–(h) show a third embodiment of the present invention, showing a trench first technique together with a deposited protective material.
Figure 3D:
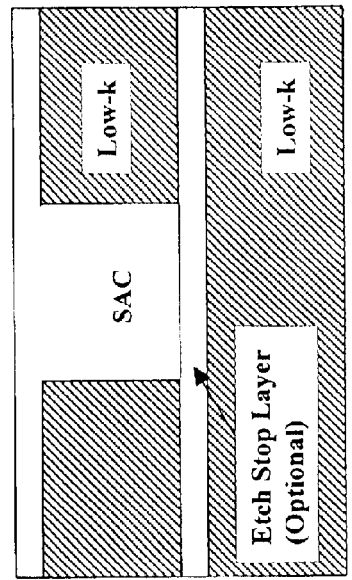
Figure 3A:
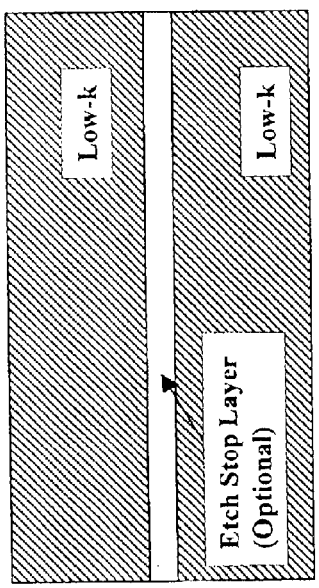
Figure 3C:
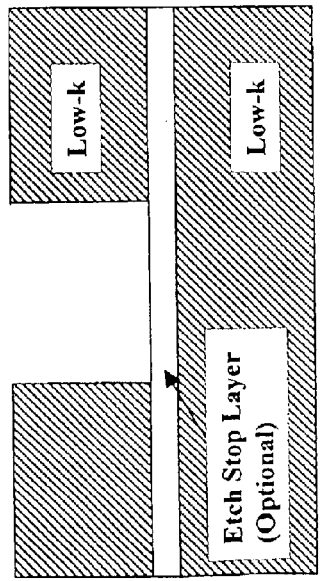
Figure 3E:
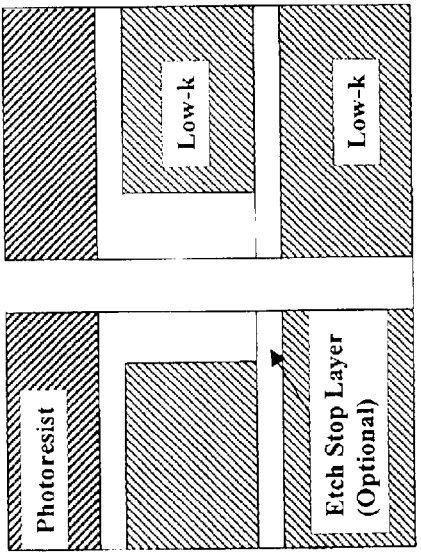
Figure 3F:
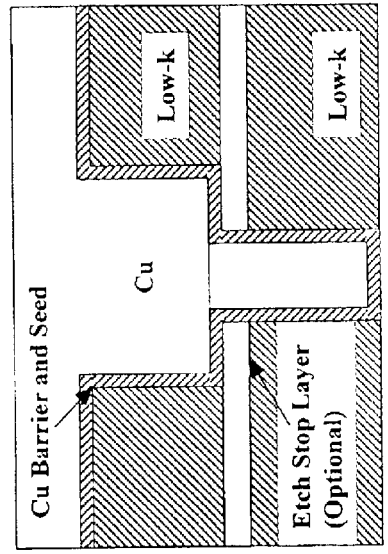
Figure 3G:
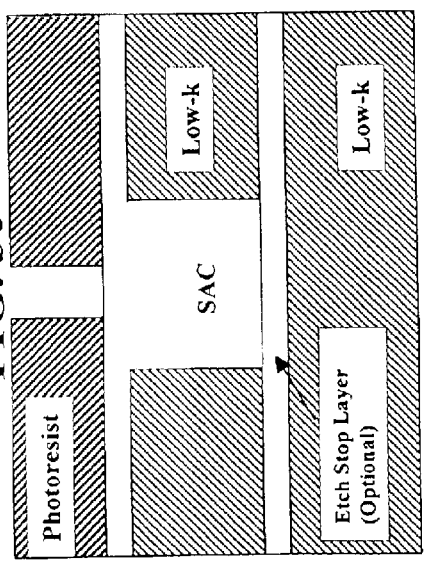
Figure 3H:
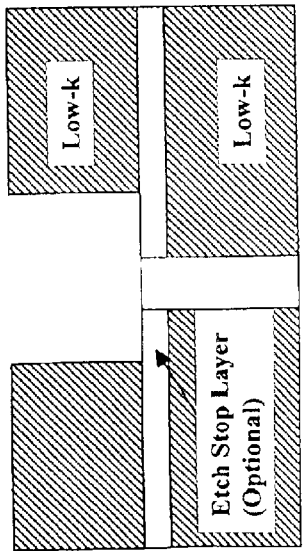

In a third embodiment of the present invention, as shown in FIG. 3(a), a first dielectric material, optional etch stop material, and second dielectric material are deposited onto a substrate as they were in the first embodiment of this invention. A layer of a photoresist material is then deposited on a top surface of the second dielectric layer, and a portion of the photoresist is imagewise removed to outline a trench for the second dielectric layer, as shown in FIG. 3(b). As also shown in FIG. 3(b), portions of the second dielectric layer which are under the removed portions of the photoresist are removed to form at least one trench down through the second dielectric layer. The balance of the photoresist layer is then removed, as shown in FIG. 3(c), and a protective material is deposited on a top surface of the second dielectric layer and on inside walls and a floor of the trench, as shown in FIG. 3(d). An additional layer of a photoresist is deposited on the protective material, and then a portion of the additional photoresist is imagewise removed to outline a via for the first dielectric layer, as shown in FIG. 3(e). Portions are removed from each layer under the removed portions of the additional photoresist, to form at least one via down through the protective material, the optional etch stop layer, and the first dielectric layer, as shown in FIG. 3(f). The balance of the additional photoresist layer is then removed, and the balance of the protective material is removed, as shown in FIG. 3(g). Inside walls and a floor of the via and the trench are lined with a barrier metal, and then the trench and via are filled with a fill metal in contact with the barrier metal lining, as shown in FIG. 3(h).

Figure 4A:
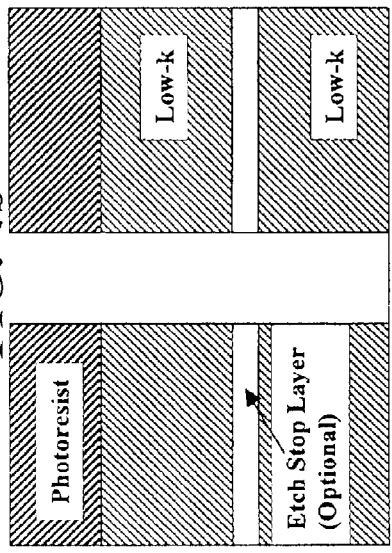
FIGS. 4(a)–(h) show a fourth embodiment of the present invention, showing a deep, via first technique together with the formation of a surface-modified protective material.
Figure 4B:
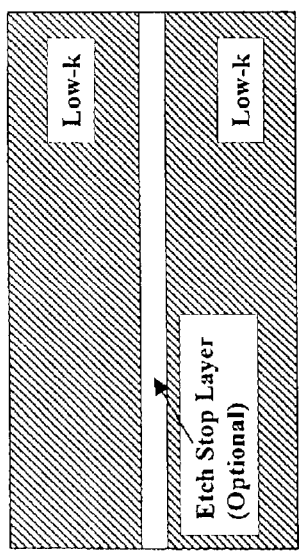
Figure 4C:
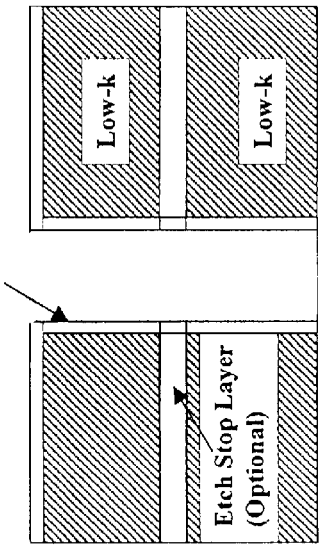
Figure 4D:
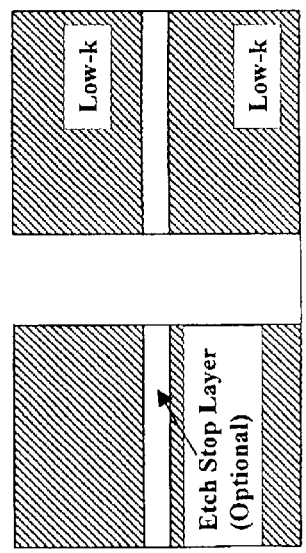
Figure 4E:
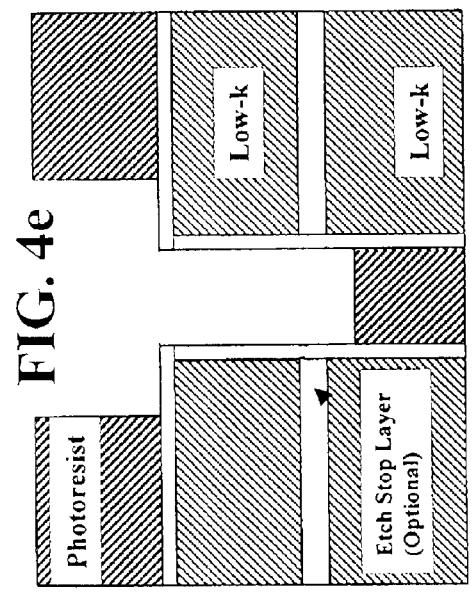
Figure 4F:
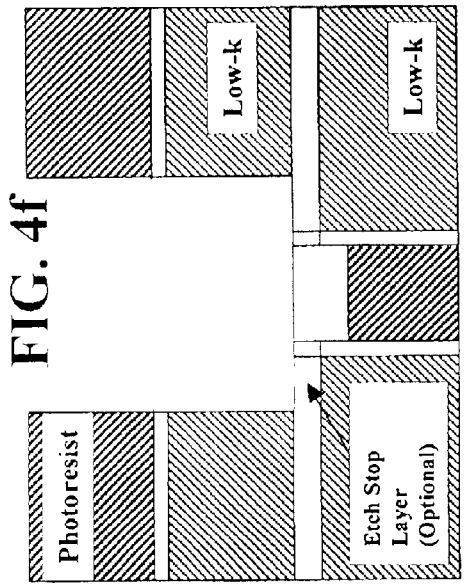
Figure 4G:
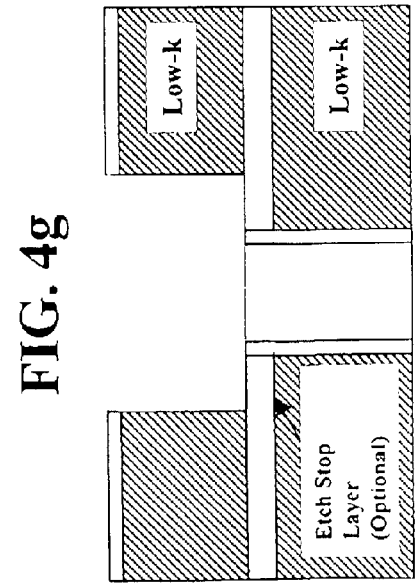
Figure 4H:
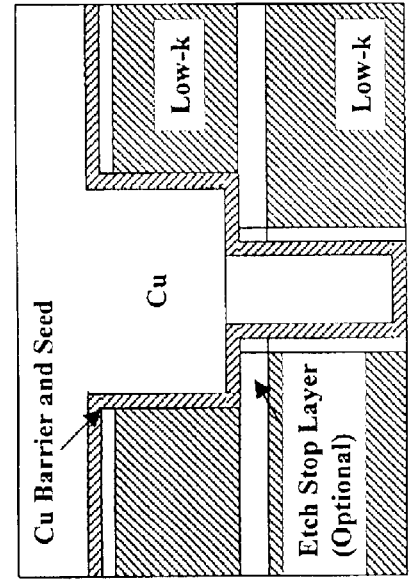

In a fourth embodiment of the present invention, as shown in FIG. 4(a), a first dielectric material, optional etch stop material, and second dielectric material are deposited onto a substrate as they were in the first embodiment of this invention. A layer of a photoresist material is then deposited on a top surface of the second dielectric layer, and a portion of the photoresist is imagewise removed to outline a via for the first dielectric layer, as shown in FIG. 4(b). As also shown in FIG. 4(b), portions are removed from each layer under the removed portions of the photoresist, to form at least one via down through the second dielectric layer, the optional etch stop layer, and first dielectric layer. The balance of the photoresist layer is then removed, as shown in FIG. 4(c). As shown in FIG. 4(d), a top surface of the second dielectric layer and a surface of inside walls and a floor of the via are modified, thus forming a protective material thereon. The depth of the modified region may vary from about 5 Å to about 1000 Å. An additional layer of a photoresist is deposited on the protective material of these modified surfaces, and a portion of the additional photoresist is imagewise removed to outline a trench for the second dielectric layer, as shown in FIG. 4(e). Portions are removed from the protective material on the top surface of the second dielectric layer, the second dielectric layer, and the walls of the via within the second dielectric layer, which are under the removed portion of the additional photoresist layer, to form at least one trench down through the second dielectric layer, as shown in FIG. 4(f). The balance of the additional photoresist layer is then removed, as shown in FIG. 4(g). Inside walls and a floor of the via and the trench are lined with a barrier metal, and then the trench and via are filled with a fill metal in contact with the barrier metal lining, as shown in FIG. 4(h). The protective material may be formed by surface modification of the walls and floor of the vias trenches and dielectric layers such as by exposure to CVD plasmas wet chemical exposure, annealing in controlled ambients, UV exposure and E-beam exposure. Suitable surface-modified CVD plasmas include $N_2/H_2$, $H_2$, $NH_3$, $N_2O$, $N_2$, $O_2$, Ar, Xe.

Figure 5A:
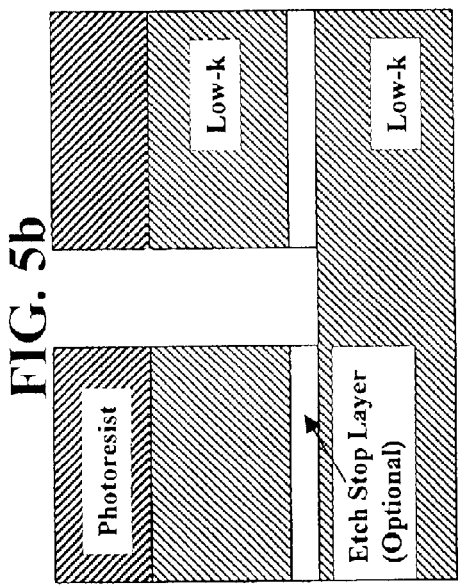
FIGS. 5(a)–(h) show a fifth embodiment of the present invention, showing a shallow, via first technique together with the formation of a surface-modified protective material.
Figure 5B:
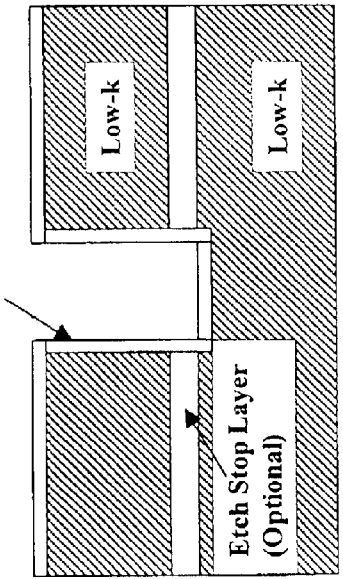
Figure 5C:
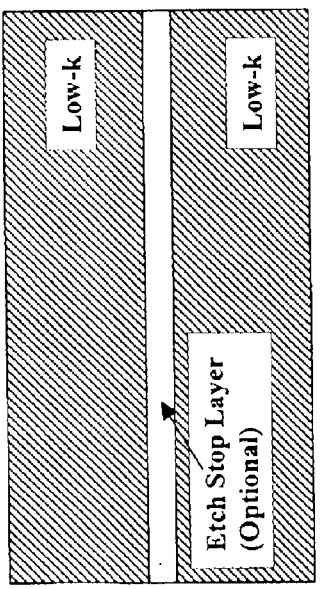
Figure 5D:
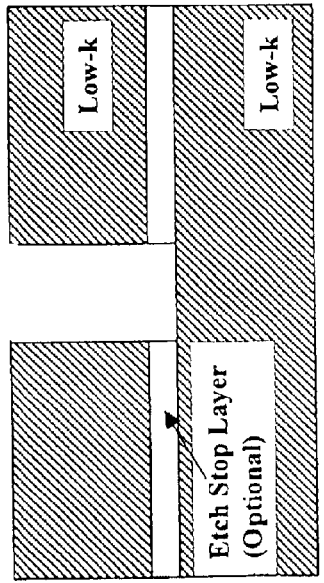
Figure 5F:
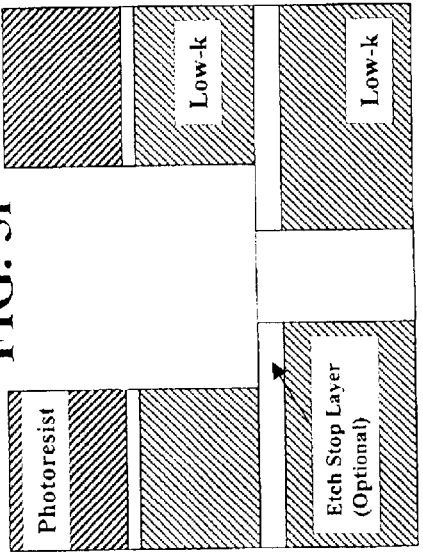
Figure 5H:
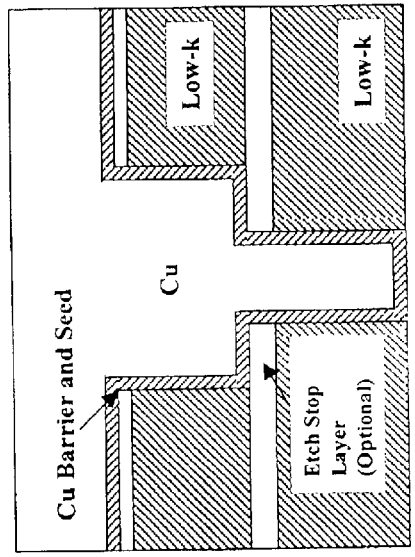
Figure 5E:
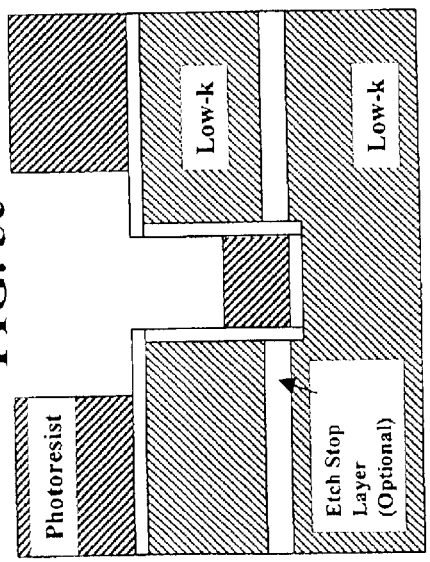
Figure 5G:
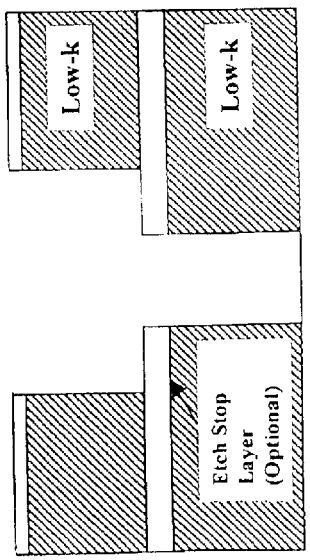

In a fifth embodiment of the present invention, as shown in FIG. 5(a), a first dielectric material, optional etch stop material, and second dielectric material are deposited onto a substrate as they were in the first embodiment of this invention. A layer of a photoresist material is then deposited on a top surface of the second dielectric layer, and a portion of the photoresist is imagewise removed to outline a via for the second dielectric layer and the optional etch stop layer, as shown in FIG. 5(b). As also shown in FIG. 5(b), portions are removed from the second dielectric layer and the optional etch stop layer which are under the removed portions of the photoresist, to form at least one via down through the second dielectric layer and the optional etch stop layer. The balance of the photoresist layer is then removed, as shown in FIG. 5(c). A top surface of the second dielectric layer and a surface of inside walls and a floor of the trench are modified, thus forming a protective material thereon, as shown in FIG. 5(d). An additional layer of a photoresist is deposited on the protective material of the modified surfaces, and a portion of the additional photoresist is imagewise removed to outline a trench for the second dielectric layer, as shown in FIG. 5(e). Portions are removed of the protective material on the top surface of the second dielectric layer, the second dielectric layer, and the protective material on the walls of the via within the second dielectric layer which are under the removed portions of the additional photoresist, to form at least one trench down through the second dielectric layer, as shown in FIG. 5(f). As also shown in FIG. 5(f), portions of the protective material on the floor of the via which was in the second dielectric layer, and portions of the first dielectric layer under the via which was in the second dielectric layer are removed to form a via down through the first dielectric layer. The balance of the additional photoresist layer is then removed, as shown in FIG. 5(g). Inside walls and a floor of the via and the trench are lined with a barrier metal, and then the trench and via are filled with a fill metal in contact with the barrier metal lining, as shown in FIG. 5(h).

Figure 6F:
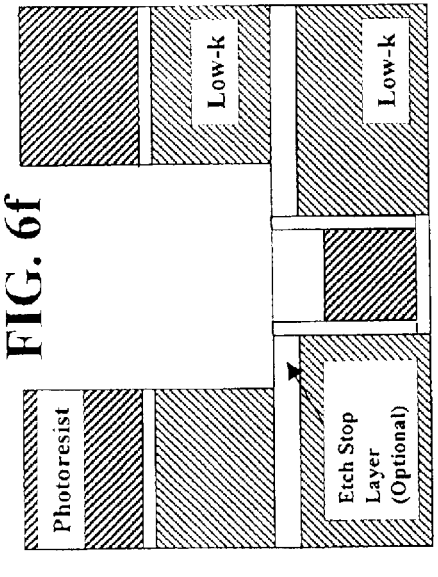
Figure 6H:
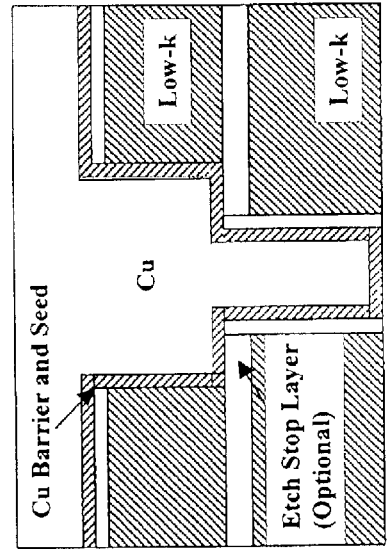
Figure 6E:
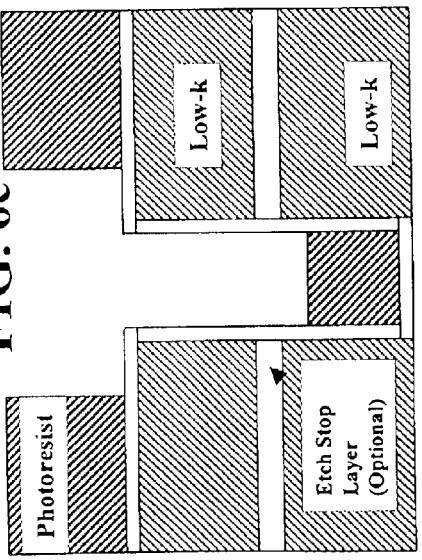
Figure 6G:
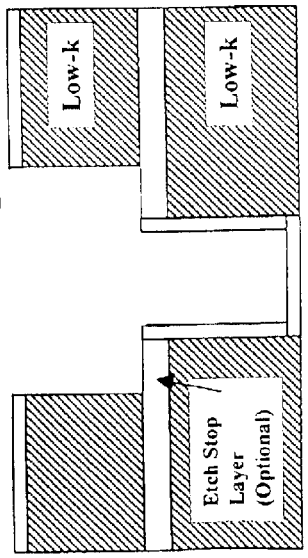

In a sixth embodiment of the present invention, as shown in FIG. 6(a), a first dielectric material, optional etch stop material, and second dielectric material are deposited onto a substrate as they were in the first embodiment of this invention. A layer of a photoresist material is then deposited on a top surface of the second dielectric layer, and a portion of the photoresist is imagewise removed to outline a via for the first dielectric layer, as shown in FIG. 6(b). As also shown in FIG. 6(b), portions are removed from each of the layers which are under the removed portions of the photoresist, to form a via down through the second dielectric layer, the optional etch stop layer, and the first dielectric layer. The balance of the photoresist layer is then removed, as shown in FIG. 6(c), and a barrier material is deposited on a top surface of the second dielectric layer and on a surface of inside walls and a floor of the via to form a barrier material layer on these surfaces, as shown in FIG. 6(d). An additional layer of a photoresist is deposited on the barrier material layer on the top surface of the second dielectric layer and on the walls and a floor of the via through the second dielectric layer, optional etch stop layer, and first dielectric layer, and a portion of the additional photoresist is imagewise removed to outline a trench for the second dielectric layer, as shown in FIG. 6(e). Portions are removed of the barrier material layer on the top surface of the second dielectric layer, the second dielectric layer, and the walls of the via within the second dielectric layer which are under the removed portion of the additional photoresist layer to form at least one trench down through the second dielectric layer, as shown in FIG. 6(f). The balance of the additional photoresist layer is then removed, as shown in FIG. 6(g). Inside walls and a floor of the via and the trench are lined with a barrier metal, and then the trench and via are filled with a fill metal in contact with the barrier metal lining, as shown in FIG. 6(h).

The barrier layer material serves to form a barrier between the photoresist and the dielectrics, thus preventing resist poisoning. Suitable barrier layer materials nonexclusively include CVD oxide, CVD nitride, CVD oxynitride, CVD SiC, spin on solutions such as organic polymers, SOG, chromophore laden SOGs as described in U.S. patent application Ser. No 09/330,248 filed Jun. 10, 1999, hydrogen silsesquioxane, methyl silsesquioxane and metals such as Ta and TaN. Preferably, the barrier layer material is CVD $SiO_2$, SiN, or SiC. The most preferred barrier layer material in the practice of this invention is $SiO_2$.

The barrier layer material may be deposited by conventional means such as CVD, evaporation, spin coating, sputtering, and atomic layer epitaxy. The thickness of protective material may vary depending on the deposition procedure.

Figure 7B:
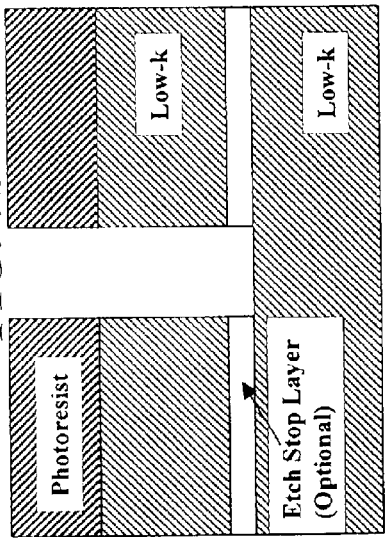
FIGS. 7(a)–(h) show a seventh embodiment of the present invention, showing a shallow, via first technique together with a barrier material layer.
Figure 7D:
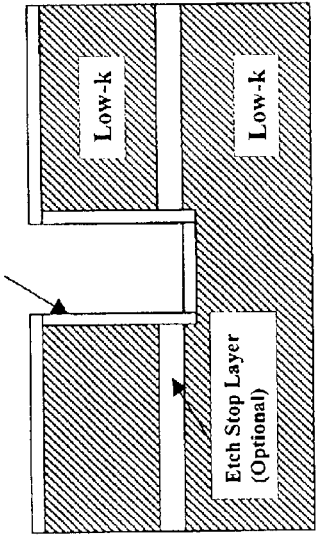
Figure 7A:
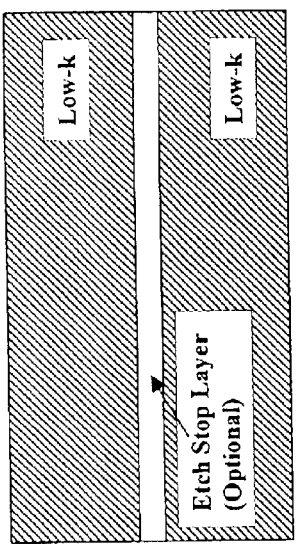
Figure 7C:
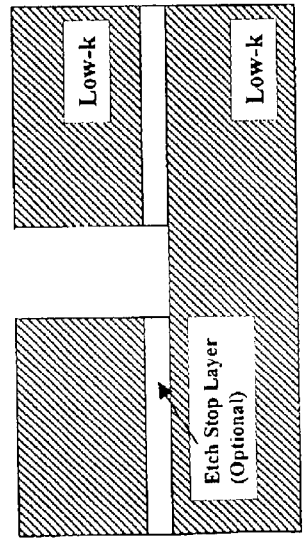
Figure 7E:
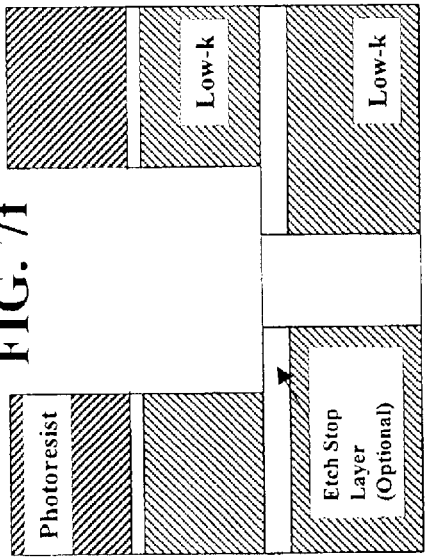
Figure 7F:
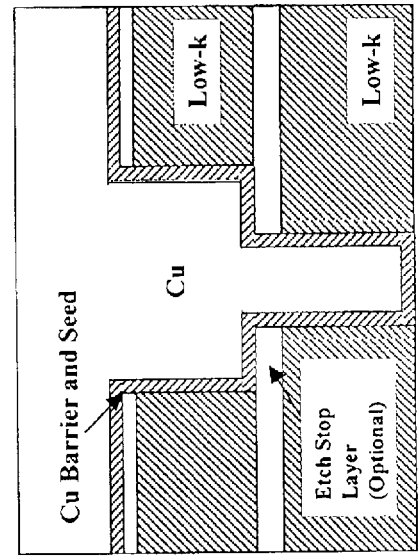
Figure 7G:
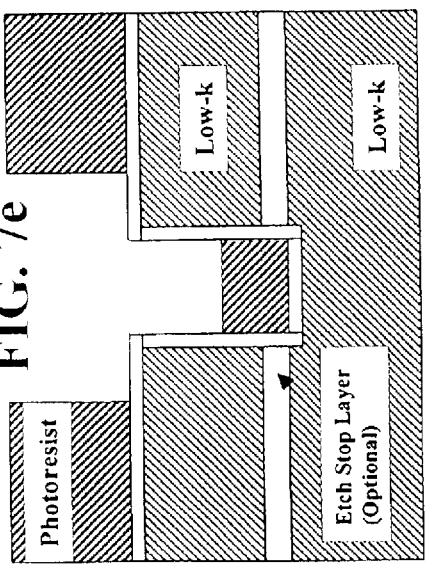
Figure 7H:
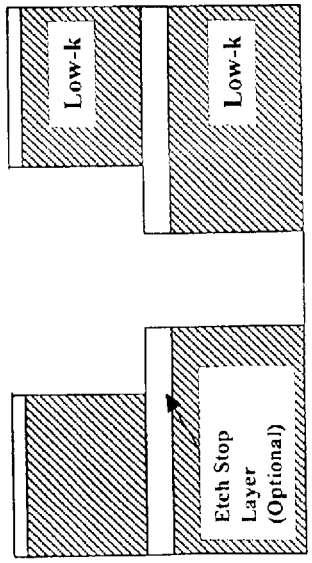

In a seventh embodiment of the present invention, as shown in FIG. 7(a), a first dielectric material, optional etch stop material, and second dielectric material are deposited onto a substrate as they were in the first embodiment of this invention. As shown in FIG. 7(b), a layer of a photoresist material is then deposited on a top surface of the second dielectric layer, and a portion of the photoresist is imagewise removed to outline a via for the second dielectric layer and the optional etch stop layer. As also shown in FIG. 7(b), portions are removed of the second dielectric layer and the optional etch stop layer which are under the removed portions of the photoresist, to form a via down through the second dielectric layer and the optional etch stop layer. The balance of the photoresist layer is then removed, as shown, in FIG. 7(c), and a barrier material is deposited on a top surface of the second dielectric layer and on a surface of inside walls and a floor of the via through the second dielectric layer and optional etch stop layer to form a barrier material layer on these surfaces, as shown in FIG. 7(d). An additional layer of a photoresist is deposited on the barrier material layer on the top surface of the second dielectric layer and on the walls and a floor of the via through the second dielectric layer and the optional etch stop layer, and a portion of the additional photoresist is imagewise removed to outline a trench for the second dielectric layer, as shown in FIG. 7(e). Portions are removed of the barrier material layer on the top surface of the second dielectric layer, the second dielectric layer, and the walls of the via within the second dielectric, layer which are under the removed portion of the additional photoresist layer to form at least one trench down through the second dielectric layer, as shown in FIG. 7(f). As also shown in FIG. 7(f), portions are removed of the barrier material layer on the floor of the via which was in the second dielectric layer, and portions are removed of the first dielectric layer under the via which was in the second dielectric layer, to form a via down through the first dielectric layer. The balance of the additional photoresist layer is then removed, as shown in FIG. 7(g). Inside walls and a floor of the via and the trench are lined with a barrier metal, and then the trench and via are filled with a fill metal in contact with the barrier metal lining, as shown in FIG. 7(h).

Figure 8A:
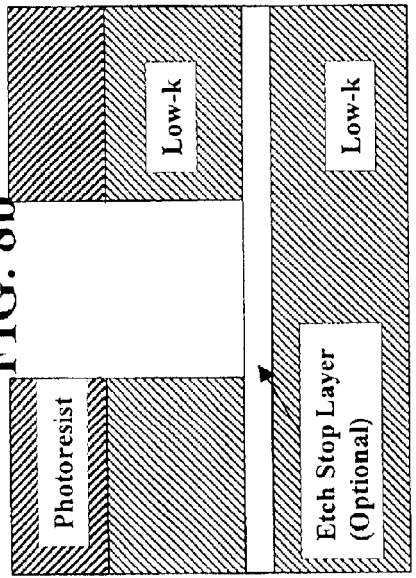
FIGS. 8(a)–(h) show an eighth embodiment of the present invention, showing a trench first technique together with the formation of a surface-modified protective material.
Figure 8B:
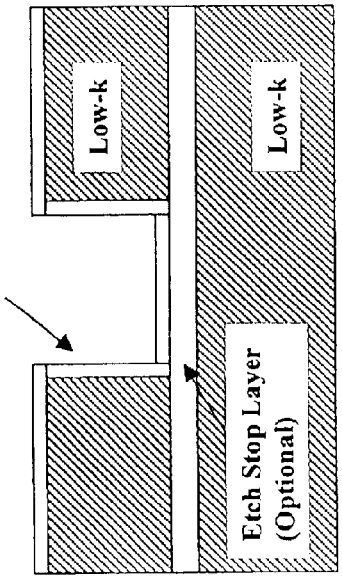
Figure 8C:
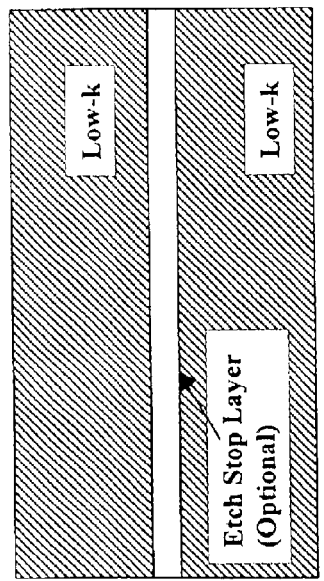
Figure 8D:
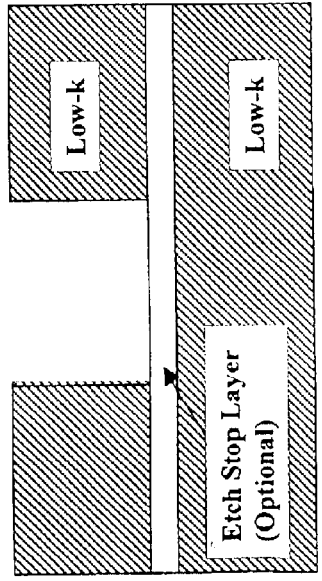
Figure 8E:
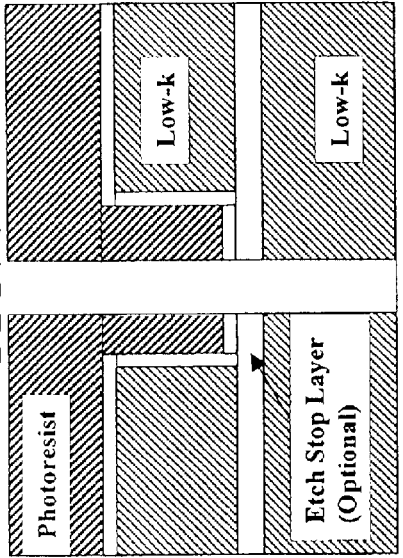
Figure 8F:
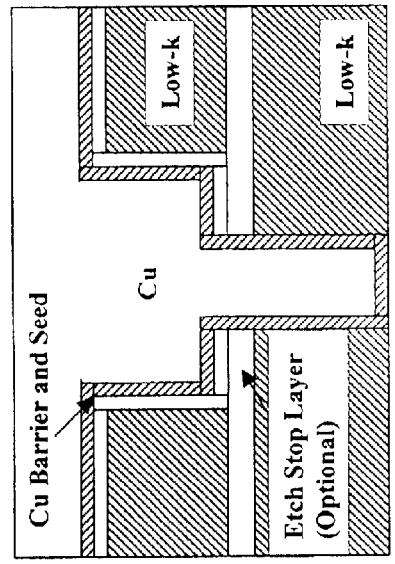
Figure 8G:
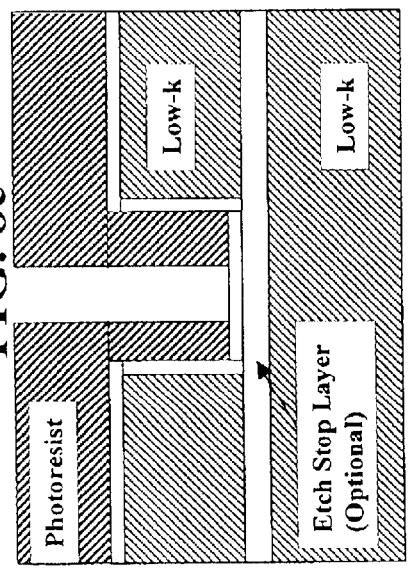
Figure 8H:
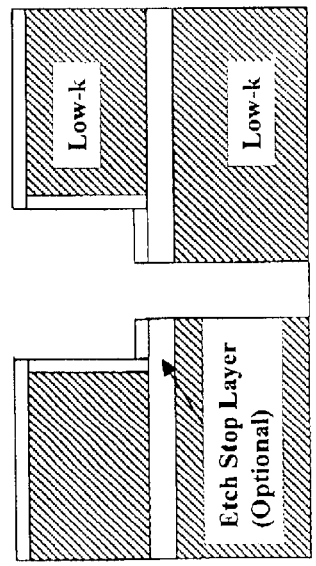

In an eighth embodiment of the present invention, as shown in FIG. 8(a), a first dielectric material, optional etch stop material, and second dielectric material are deposited onto a substrate as they were in the first embodiment of this invention. As shown in FIG. 8(b), a layer of a photoresist material is then deposited on a top surface of the second dielectric layer, and a portion of the photoresist is imagewise removed to outline a trench for the second dielectric layer. As also shown in FIG. 8(b), portions of the second dielectric layer which are under the removed portions of the photoresist are removed to form at least one trench down through the; second-dielectric layer. The balance of the photoresist layer is then removed, as shown in FIG. 8(c), and the top surface of the second dielectric layer and a surface of inside walls and a floor of the trench are modified to form a protective material thereon, as shown in FIG. 8(d). An additional layer of a photoresist is deposited on the protective material on the top surface of the second dielectric layer and on the walls and a floor of the trench, and a portion of the additional photoresist is imagewise removed to outline a via for the first dielectric layer, as shown in FIG. 8(e). Portions are removed each layer which are under the re moved portion of the additional photoresist layer to form at least one via down through the first dielectric layer, as shown in FIG. 8(f). The balance of the additional photoresist layer is then removed, as shown in FIG. 8(g). Inside walls and a floor of the via and the trench are lined with a barrier metal, and then the trench and via are filled with a fill metal in contact with the barrier metal lining, as shown in FIG. 8(h).

Figure 9B:
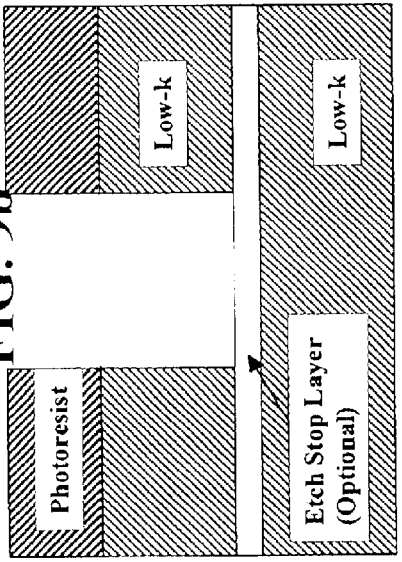
FIGS. 9(a)–(h) show a ninth embodiment of the present invention, showing a trench first technique together with a barrier material layer.
Figure 9D:
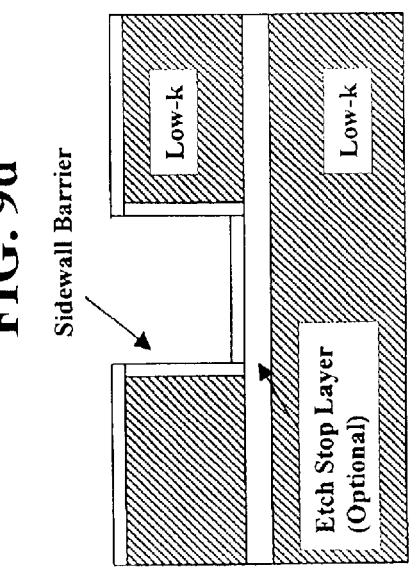
Figure 9A:
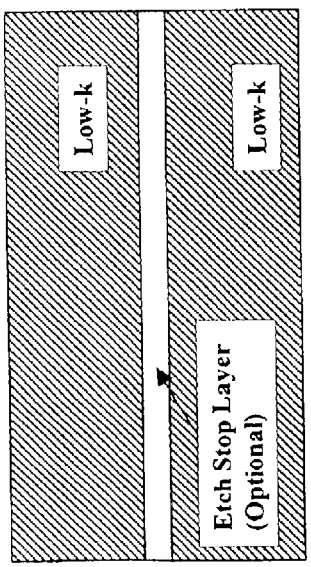
Figure 9C:
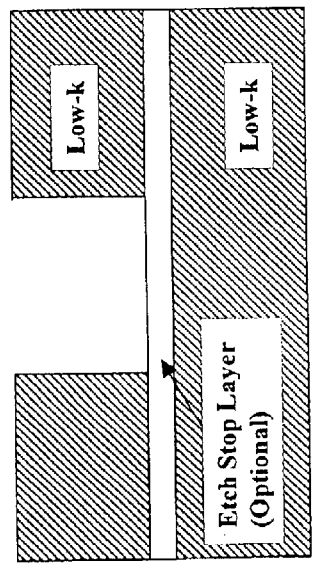
Figure 9F:
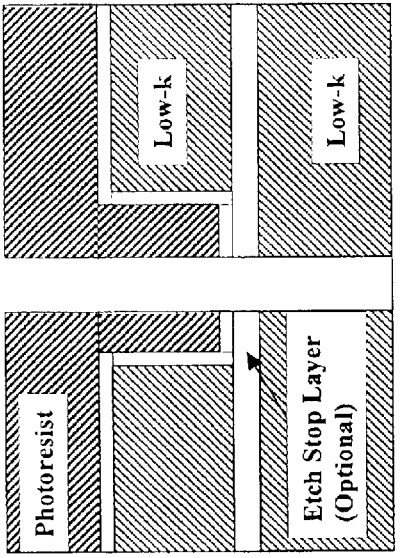
Figure 9E:
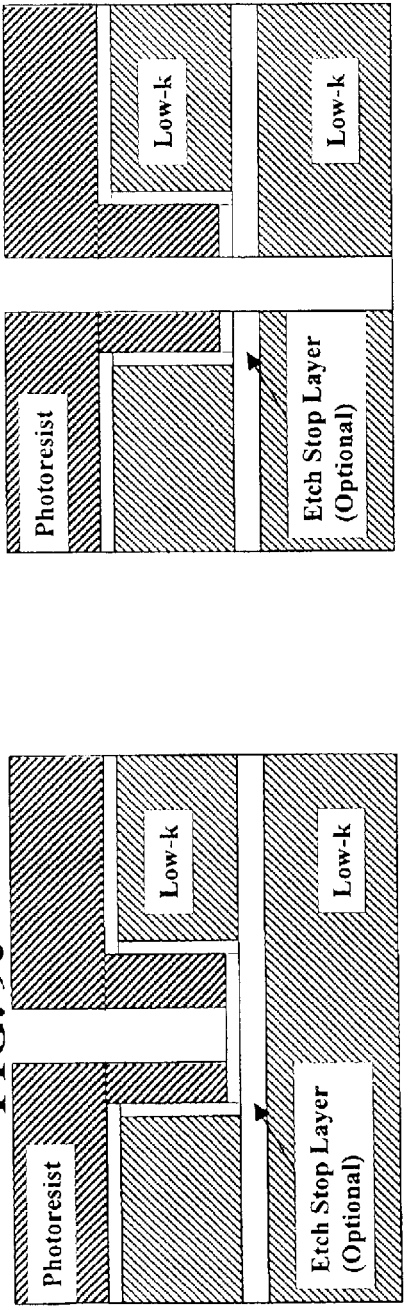
Figure 9H:
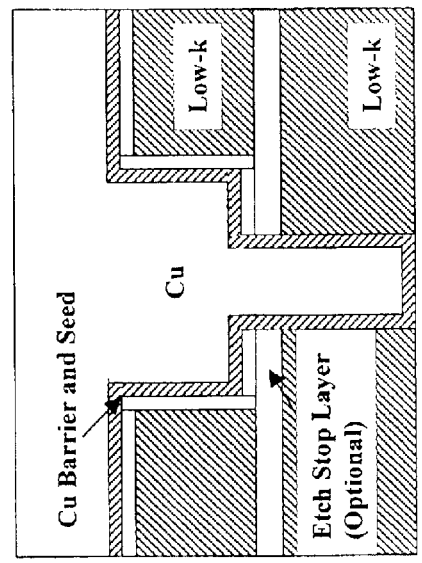
Figure 9G:
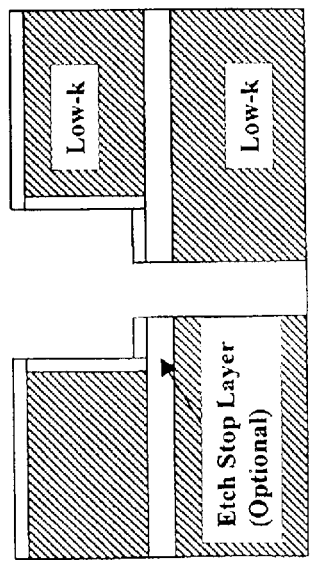

In a ninth embodiment of the present invention, as shown in FIG. 9(a), a first dielectric material, optional etch stop material, and second dielectric material are deposited onto a substrate as they were in the first embodiment of this invention. As shown in FIG. 9(b), a layer of a photoresist material is then deposited on a top surface of the second dielectric layer, and a portion of the photoresist is imagewise removed to outline a trench for the second dielectric layer. As also shown in FIG. 9(b), portions of the second dielectric layer, and optionally portions of the etch stop layer if present which are under the removed portions of the photoresist are removed to form at least one trench down through the second dielectric layer and optionally through the etch stop layer. The balance of the photoresist layer is then removed, as shown in FIG. 9(c), and a barrier material is deposited on a top surface of the second dielectric layer and on a surface of inside walls and a floor of the trench to form a barrier material layer thereon, as shown in FIG. 9(d). An additional layer of a photoresist is deposited on the barrier material layer on the top surface of the second dielectric layer and on the walls and a floor of the trench, and a portion of the additional photoresist is imagewise removed to outline a via for the first dielectric layer, as shown in FIG. 9(e). Portions are removed of the barrier material layer on the floor of the trench, any remaining portions of the etch stop layer, and portions of the first, dielectric layer which are under the removed portion of the additional photoresist layer to form at least one via down through the barrier material layer on the floor of the trench, the optional etch stop layer, and the first dielectric layer, as shown in FIG. 9(f). The balance of the additional photoresist layer is then removed, as shown in FIG. 9(g). Inside walls and a floor of the via and the trench are lined with a barrier metal, and then the trench and via are filled with a fill metal in contact with the barrier metal lining, as shown in FIG. 9(h).

Figure 10A:
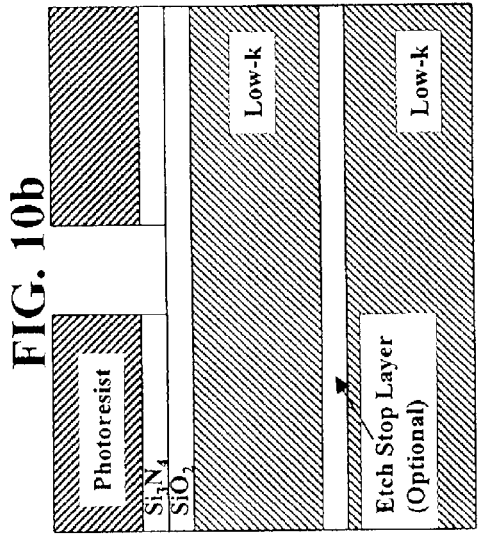
FIGS. 10(a)–(h) show a tenth embodiment of the present invention, showing a via first technique together with first and second hardmask layers.
Figure 10B:
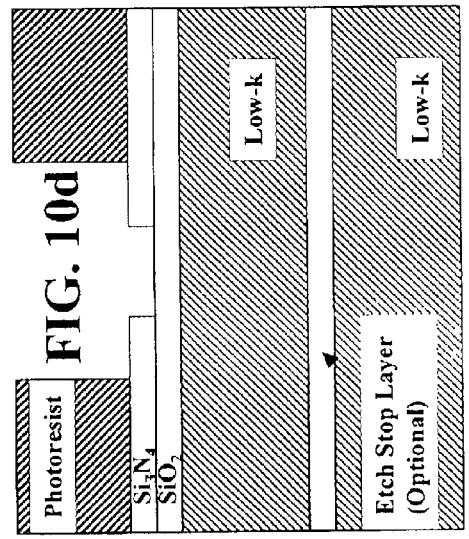
Figure 10C:
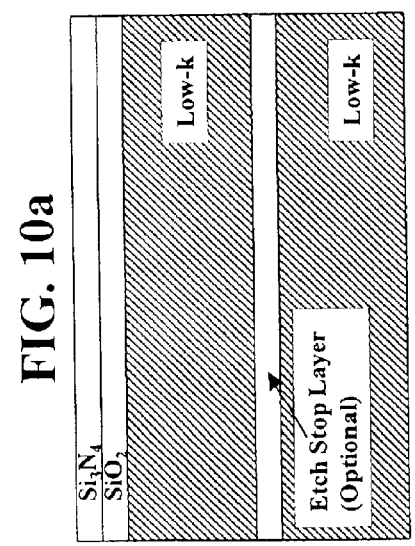

In a tenth embodiment of the present invention, as shown in FIG. 10(a), a first dielectric material, optional etch is top material, and second dielectric material are deposited onto a substrate as they were in the first embodiment of this invention. As also shown in FIG. 10(a), a layer of a first hardmask material is then deposited on the second dielectric layer, and a layer of a second hardmask layer is deposited on the first hardmask layer. A layer of a photoresist material is then deposited on the top surface of the second hardmask layer, and a portion of the photoresist is imagewise removed to outline a via for the second hardmask layer, as shown in FIG. 10(b). Portions are removed from the second hardmask layer under the removed portions of the photoresist, to form at least one via down through the second hardmask layer, as also shown in FIG. 10(b). The balance of the photoresist layer is then removed, as shown in FIG. 10(c).

Figure 10D:
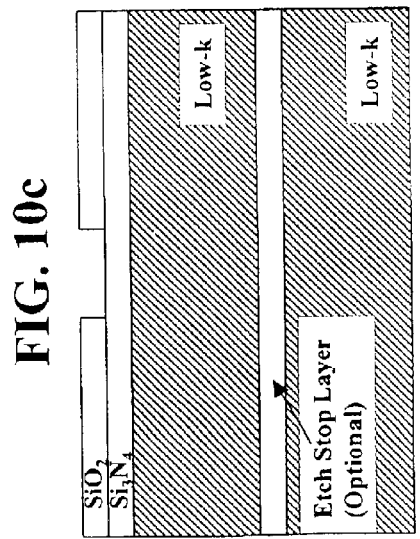
Figure 10F:
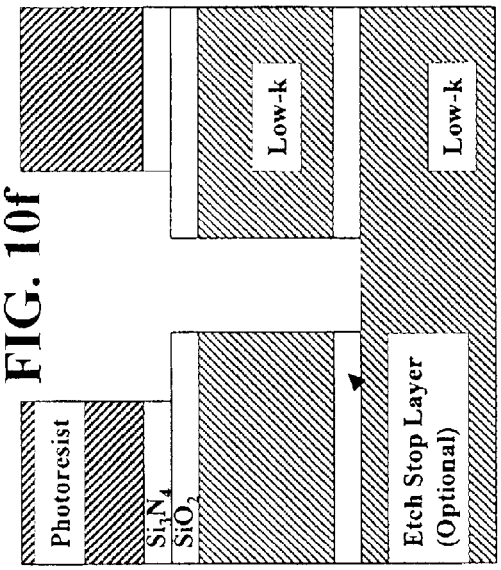
Figure 10E:
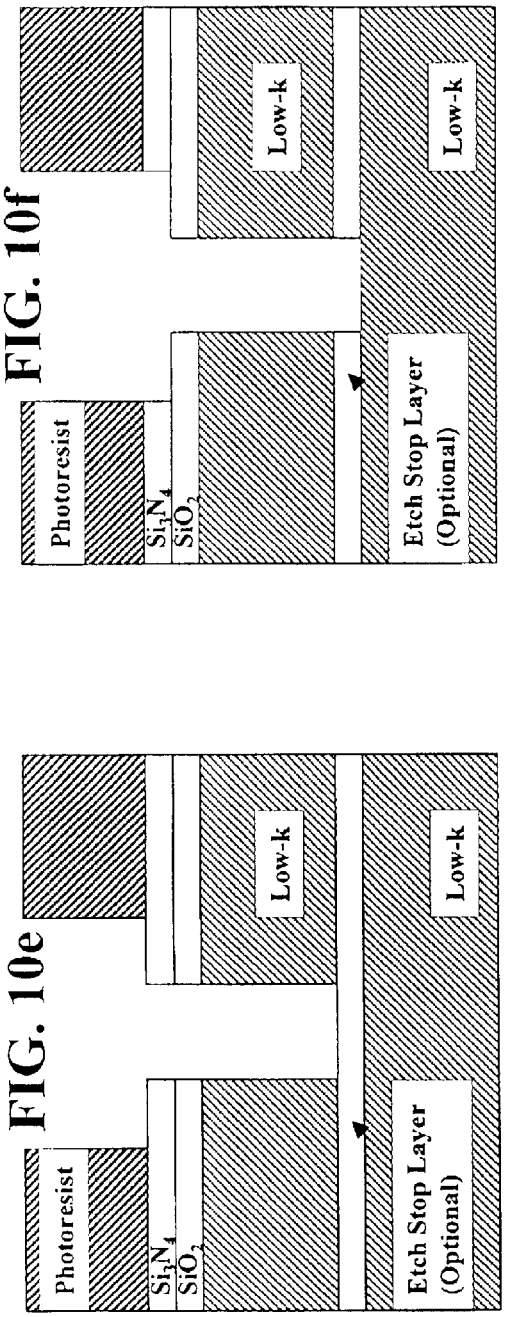
Figure 10H:
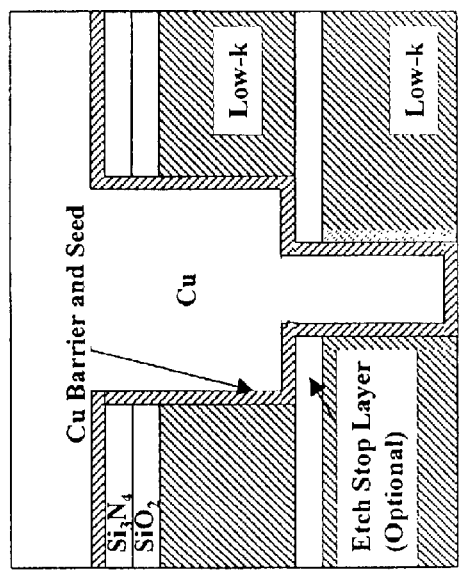
Figure 10G:
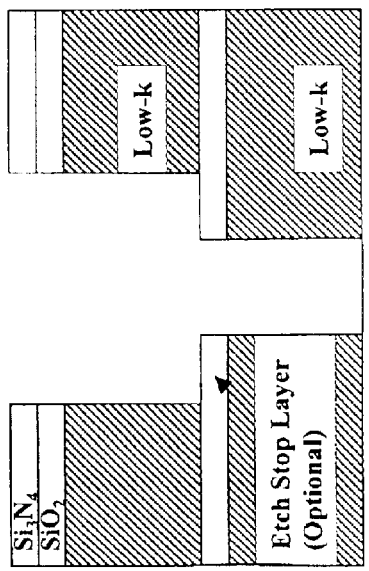

An additional layer of a photoresist is deposited on the second hardmask layer, and on inside walls and a floor of the via in the second hardmask layer, as shown in FIG. 10(d). As also shown in FIG. 10(d), a portion of the additional photoresist is imagewise removed to outline at least one trench for the second hardmask layer. Portions are removed from the first hardmask layer and the second dielectric layer which are under the via in the second hardmask layer, to form a via down through the first hardmask layer and the second dielectric layer, as shown in FIG. 10(e). Portions are then removed from second hardmask layer which are under the removed portions of the additional photoresist, to form a trench down through the second hardmask layer, as shown in FIG. 10(f). As also shown in FIG. 10(f), portions are removed of the optional etch stop layer which are under the via in the second dielectric layer, to extend the via down through the optional etch stop layer. Portions are then removed of the first hardmask layer and the second dielectric layer which are under the trench in the second hardmask layer, to form trench down through the first hardmask layer and the second dielectric layer, as shown in FIG. 10(g). This figure also shows that, portions are then removed of the first dielectric layer under the via which was in the second dielectric layer, to form a via through the first dielectric layer. As also shown in FIG. 10(g), the balance of the additional photoresist layer is then removed. This figure also shows that a via is then formed through the first dielectric layer under the via which was previously formed through the second dielectric layer. Portions of the first hardmask layer and second dielectric layer which are under the trench in the second hardmask layer are then removed to form a trench through the second dielectric layer, as also shown in FIG. 10(g). Inside walls and a floor of the via and the trench are lined with a barrier metal, and then the trench and via are filled with a fill metal in contact with the barrier metal lining, as shown in FIG. 10(h).

Figure 11B:
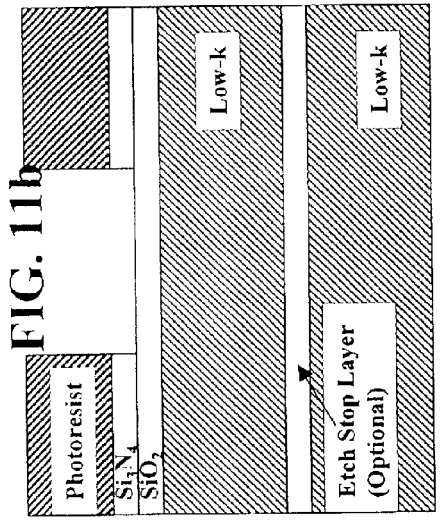
FIGS. 11(a)–(h) show an eleventh embodiment of the present invention, showing a trench first technique together with first and second hardmask layers.
Figure 11D:
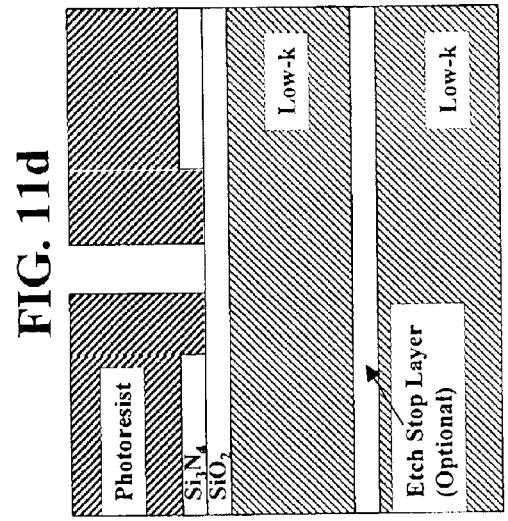
Figure 11A:
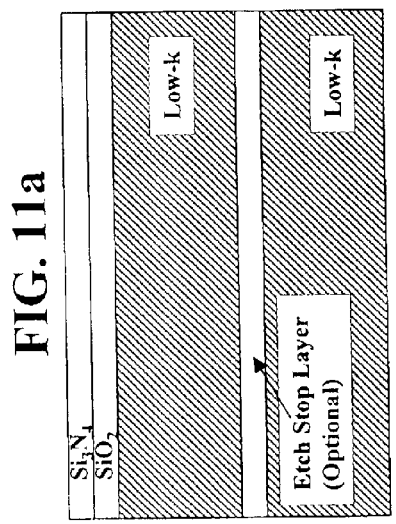
Figure 11C:
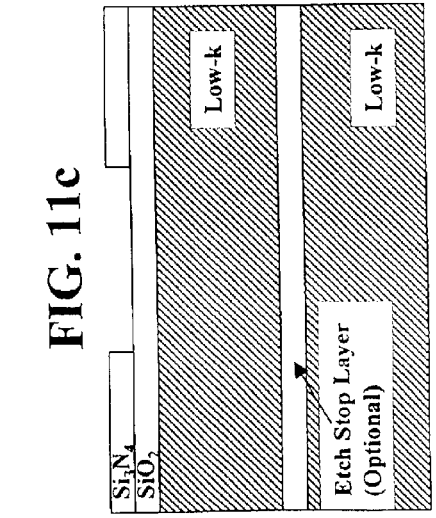
Figure 11E:
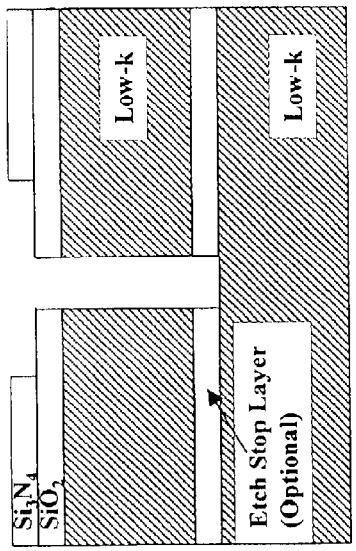
Figure 11F:
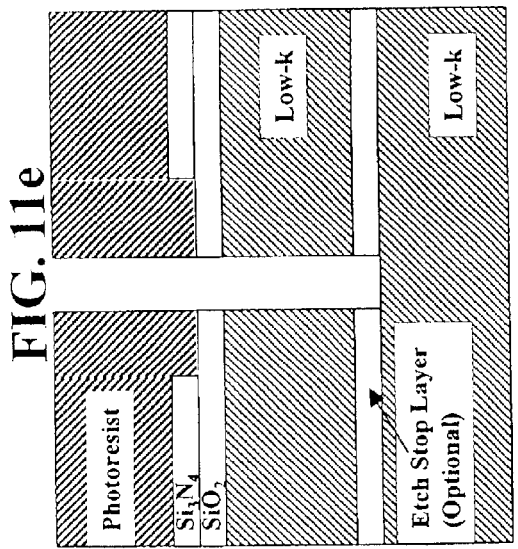
Figure 11G:
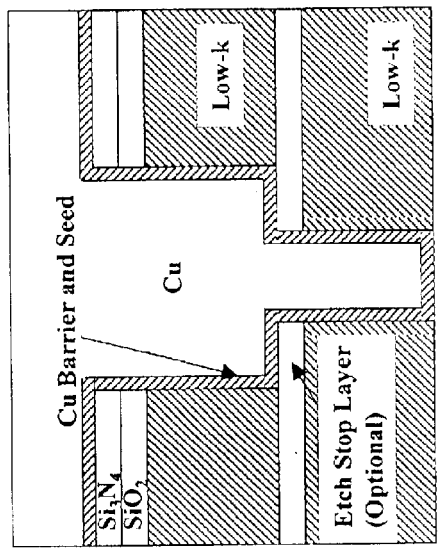
Figure 11H:
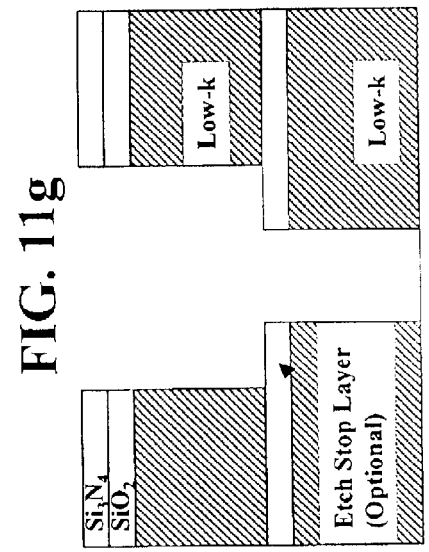

In an eleventh embodiment of the present invention, as shown in FIG. 11(a), a first dielectric material, optional etch stop material, and second dielectric material are deposited onto a substrate as they, were in the first embodiment of this invention. As also shown in FIG. 11(a), a layer of a first hardmask material is then deposited on the second dielectric layer, and a layer of a second hardmask layer is deposited on the first hardmask layer. A layer of a photoresist material is then deposited on the top surface of the second hardmask layer, and a portion of the photoresist is imagewise removed to outline a trench for the second hardmask layer, as shown in FIG. 11(b). As also shown in FIG. 11(b), portions are removed from the second hardmask layer under the removed portions of the photoresist, to form at least one trench down through the second hardmask layer. The balance of the photoresist layer is then removed, as shown in FIG. 11(c). An additional layer of a photoresist is deposited on the second hardmask layer, and on inside walls and a floor of the trench in the second hardmask layer, as shown in FIG. 11(d). As also shown in FIG. 11(d), a portion of the additional photoresist is imagewise removed to outline at least one via for the second dielectric layer and the optional etch stop layer. As shown in FIG. 11(e), portions are removed from the first hardmask layer, the second dielectric layer, and the optional etch stop layer which are under the removed portion of the additional photoresist layer, to form a via down through the second dielectric layer and optional etch stop layer. The balance of the additional photoresist layer is then removed, as shown in FIG. 11(f). Portions are removed of the first hardmask layer and the second dielectric layer which are under the trench in the second hardmask layer, to form a trench down through the second dielectric layer, as shown in FIG. 11(g). As also shown in FIG. 11(g), portions are then removed of the first dielectric layer corresponding to the via which was in the second dielectric layer or optional etch stop layer, thus forming at least one via down through the first dielectric layer. Inside walls and a floor of the via and the trench are lined with a barrier metal, and then the trench and via are filled with a fill metal in contact with the barrier metal lining, as shown in FIG. 11(h).

The first and second hardmask layers serve to form a mask which prevents the photoresist from reacting with the dielectrics, thus preventing resist poisoning.

Suitable hardmask layer materials nonexclusively include CVD films such as SiO2, SiN, SiON, SiOC, SiC, spin on polymers such as spin on glass, chromophore laden SOG, organic spin on polymers, hydrogen silsesquioxane, methyl silsesquioxane and metals such as Ta, TaN. Preferably, the hardmask layer material is $SiO_2$, SiON, SiN, or SiC. Most preferably, the first hardmask layer comprises $SiO_2$, and the second hardmask layer comprises $Si_3N_4$. Although this application refers only to first and second hardmask layers, a plurality of hardmask layers be used in the practice of the present invention. The hardmask layers may be deposited by conventional means such as CVD, spin-on, evaporation, sputtering, atomic layer epitaxy. The thickness of the hardmask layers may be the same or different, and may vary depending on the deposition procedure and parameter setup. The thicknesses preferably range from about 100 Å to about 5000 Å, more preferably from about 200 Å to about 3000 Å, and most preferably from about 400 Å to about 1500 Å.

The figures of the present invention show a process for the formation of one interconnect level, however, the same processing steps can be repeated again for upper levels of interconnects.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A process for producing a microelectronic device which comprises:
   (a) forming a first dielectric layer on a substrate;
   (b) forming an optional etch stop layer on the first dielectric layer;
   (c) forming a second dielectric layer on the first dielectric layer or the optional etch stop layer;
   (d) depositing a layer of a photoresist on a top surface of the second dielectric layer and imagewise removing a portion of the photoresist corresponding to at least one via for the first dielectric layer;
   (e) removing the portions of each layer which are under the removed portions of the photoresist thus forming at least one via through the second dielectric layer, the optional etch stop layer, and first dielectric layer, and removing the balance of the photoresist layer;
   (f) modifying the top surface of the second dielectric layer, and a surface of inside walls of the at least one via through the second dielectric layer, optional etch stop layer, and first dielectric layer thus forming a protective material thereon;
   (g) depositing an additional layer of a photoresist on the protective material on the top surface of the second dielectric layer and on the protective material on the walls and a floor of the at least one via through the second dielectric layer, optional etch stop layer, and first dielectric layer, and imagewise removing a portion of the photoresist corresponding to at least one trench for the second dielectric layer;
   (h) removing the portions of the protective material on the top surface of the second dielectric layer, the second dielectric layer, and the walls of the at least one via within the second dielectric layer, which are under the removed portion of the additional photoresist layer thus forming at least one trench down through the second dielectric layer, and removing the balance of the additional photoresist layer;
   (i) lining a barrier metal on inside walls and a floor of the at least one trench, and on inside walls and a floor of the at least one via; and
   (j) filling the trench and the at least one via with a fill metal in contact with the barrier metal lining.

2. The process of claim 1 wherein the first dielectric layer comprises an organic dielectric material and the second dielectric layer comprises an inorganic dielectric material.

3. The process of claim 1 wherein the first dielectric layer comprises an inorganic dielectric material and the second dielectric layer comprises an organic dielectric material.

4. The process of claim 1 wherein the first dielectric layer comprises an inorganic dielectric material and the second dielectric layer comprises an inorganic dielectric material.

5. The process of claim 1 wherein the first dielectric layer comprises an organic dielectric material and the second dielectric layer comprises an organic dielectric material.

6. The process of claim 1 wherein the optional etch stop layer is not present and wherein the first dielectric layer and the second dielectric layer have substantially the same etch resistance properties.

7. The process of claim 1 wherein the protective material comprises CVD oxide, CVD nitride, CVD oxynitride, CVD SiC, spin on glass, organic polymers, chromophore laden spin on glass, anti reflective coating materials, bottom anti reflective coating materials, silicon oxynitride, hydrogen silsesquioxane, methyl silsesquioxane, metals or combinations thereof.

8. The process of claim 1 wherein the barrier metal comprises Ti, Ta, or a nitride.

9. The process of claim 1 wherein the fill metal comprises aluminum, aluminum alloys, copper, copper alloys, tantalum, tungsten, titanium, nitrides thereof or combinations thereof.

10. The process of claim 1 wherein the top surface of the second dielectric layer and the surface of inside walls of the via are modified by exposure to CVD plasmas, wet chemical exposure, annealing, UV exposure, electron beam exposure, or combinations thereof.

11. The process of claim 10 wherein the CVD plasma comprises $N_2/H_2$, $H_2$, $NH_3$, $N_2O$, $N_2$, $O_2$, Ar, Xe, or combinations thereof.

12. The process of claim 1 wherein the optional etch stop is present and comprises silicon nitride, silicon oxynitride, silicon dioxide, silicon carbide, silicon oxycarbide, spin on glass, organic polymers, hydrogen silsesquioxane, methyl silsesquioxane or combinations thereof.

13. A process for producing a microelectronic device which comprises:
   (a) forming a first dielectric layer on a substrate;
   (b) forming an optional etch stop layer on the first dielectric layer;
   (c) forming a second dielectric layer on the first dielectric layer or the optional etch stop layer;
   (d) depositing a layer of a photoresist on a top surface of the second dielectric layer and imagewise removing a portion of the photoresist corresponding to at least one via for the second dielectric layer and the optional etch stop layer;
   (e) removing the portions of the second dielectric layer and the optional etch stop layer which are under the removed portions of the photoresist thus forming at least one via down through the second dielectric layer and the optional etch stop layer, and removing the balance of the photoresist layer;
   (f) modifying a top surface of the second dielectric layer, and a surface of inside walls of and a floor of the at least one via through the second dielectric layer and optional etch stop layer thus forming a protective material thereon;
   (g) depositing an additional layer of a photoresist on the protective material on the top surface of the second dielectric layer and on the protective material on the walls and floor of the at least one via through the second dielectric layer and the optional etch stop layer, and imagewise removing a portion of the phororesist corresponding to at least one trench for the second dielectric layer;

(h) removing the portions of the protective material on the top surface of the second dielectric layer, the second dielectric layer, and the protective material on the walls of the at least one via within the second dielectric layer which are under the removed portion of the additional photoresist layer thus forming at least one trench down through the second dielectric layer, and removing the portions of the protective material on the floor of the at least one via which was in the second dielectric layer, and portions of the first dielectric layer under the at least one via which was in the second dielectric layer thus forming at least one via down through the first dielectric layer;

(i) removing the balance of the additional photoresist layer;

(j) lining a barrier metal on inside walls and a floor of the at least one trench, and on inside walls and a floor of the at least one via; and (k) filling the trench and the at least one via with a fill metal in contact with the barrier metal lining.

14. The process of claim 13 wherein the first dielectric layer comprises an organic dielectric material and the second dielectric layer comprises an inorganic dielectric material.

15. The process of claim 13 wherein the first dielectric layer comprises an inorganic dielectric material and the second dielectric layer comprises an organic dielectric material.

16. The process of claim 13 wherein the first dielectric layer comprises an inorganic dielectric material and the second dielectric layer comprises an inorganic dielectric material.

17. The process of claim 13 wherein the first dielectric layer comprises an organic dielectric material and the second dielectric layer comprises an organic dielectric material.

18. The process of claim 13 wherein the etch stop layer is present and comprises silicon nitride, silicon oxynitride, silicon dioxide, silicon carbide, silicon oxycarbide, spin on glass, organic polymers, hydrogen silsesquioxane, methyl silsesquioxane or combinations thereof.

19. The process of claim 13 wherein the optional etch stop layer is not present and wherein the first dielectric layer and the second dielectric layer have substantially the same etch resistance properties.

20. The process of claim 13 wherein the protective material comprises CVD oxide, CVD nitride, CVD oxynitride, CVD SiC, spin on glass, organic polymers, chromophore laden spin on glass, anti reflective coating materials, bottom anti reflective coating materials, silicon oxynitride, hydrogen silsesquioxane, methyl silsesquioxane, metals or combinations thereof.

21. The process of claim 13 wherein the barrier metal comprises Ti, Ta, or a nitride.

22. The process of claim 13 wherein the fill metal comprises aluminum, aluminum alloys, copper, copper alloys, tantalum, tungsten, titanium, nitrides thereof or combinations thereof.

23. The process of claim 13 wherein the top surface of the second dielectric layer and the surface of inside walls and the floor of the via are modified by exposure to CVD plasma, wet chemical exposure, annealing, UV exposure, electron beam exposure or combinations thereof.

24. The process of claim 23 wherein the CVD plasma comprises $N_2/H_2$, $H_2$, $NH_3$, $N_2O$, $N_2$, $O_2$, Ar, Xe, or combinations thereof.

* * * * *